(12) United States Patent
Ma

(10) Patent No.: US 8,694,845 B2
(45) Date of Patent: Apr. 8, 2014

(54) METHODS AND SYSTEMS FOR TESTING ELECTRONIC CIRCUITS

(76) Inventor: Ssu-Pin Ma, San Jose, CA (US)

( * ) Notice: Subject to any disclaimer, the term of this patent is extended or adjusted under 35 U.S.C. 154(b) by 272 days.

(21) Appl. No.: 12/766,886

(22) Filed: Apr. 25, 2010

(65) Prior Publication Data

US 2011/0264973 A1 Oct. 27, 2011

(51) Int. Cl.
*G01R 31/28* (2006.01)
*G06F 11/00* (2006.01)

(52) U.S. Cl.
USPC .......................................... 714/736; 714/738

(58) Field of Classification Search
None
See application file for complete search history.

(56) References Cited

U.S. PATENT DOCUMENTS

| | | | | |
|---|---|---|---|---|
| 4,051,460 | A * | 9/1977 | Yamada et al. | 711/115 |
| 5,159,598 | A * | 10/1992 | Welles et al. | 714/724 |
| 7,685,487 | B1 * | 3/2010 | Kuo et al. | 714/726 |
| 2003/0093731 | A1 * | 5/2003 | Whannel et al. | 714/726 |
| 2003/0126534 | A1 * | 7/2003 | Roy et al. | 714/742 |
| 2003/0191993 | A1 * | 10/2003 | Miwa | 714/718 |
| 2003/0233604 | A1 * | 12/2003 | Lin et al. | 714/718 |
| 2004/0015757 | A1 * | 1/2004 | Ohlhoff et al. | 714/719 |
| 2004/0107396 | A1 * | 6/2004 | Barone et al. | 714/733 |
| 2004/0181724 | A1 * | 9/2004 | McBride | 714/735 |
| 2005/0060621 | A1 * | 3/2005 | Lee et al. | 714/718 |
| 2005/0120284 | A1 * | 6/2005 | Ouellette et al. | 714/718 |
| 2005/0149803 | A1 * | 7/2005 | Hirano et al. | 714/738 |
| 2006/0156136 | A1 * | 7/2006 | McBride | 714/736 |
| 2007/0198880 | A1 * | 8/2007 | Takazawa et al. | 714/718 |
| 2007/0288817 | A1 * | 12/2007 | Tanaka et al. | 714/724 |
| 2008/0005630 | A1 * | 1/2008 | Adsitt | 714/718 |
| 2008/0077836 | A1 * | 3/2008 | Khoche et al. | 714/733 |
| 2008/0141087 | A1 * | 6/2008 | Whetsel | 714/726 |
| 2008/0178054 | A1 * | 7/2008 | Lee et al. | 714/719 |
| 2008/0222464 | A1 * | 9/2008 | Gorman et al. | 714/718 |
| 2008/0282121 | A1 * | 11/2008 | Rajeev et al. | 714/719 |
| 2009/0024885 | A1 * | 1/2009 | Anzou et al. | 714/719 |
| 2009/0044062 | A1 * | 2/2009 | Shin et al. | 714/718 |
| 2010/0251043 | A1 * | 9/2010 | Anzou et al. | 714/719 |

OTHER PUBLICATIONS http://www.eetimes.com/electronics-news/4372280/Semiconductor-probe-card-sales-projected-flat-for-2012, May 3, 2012. "Semi probe card sales projected flat for 2012."
http://www.mjc.co.jp/eng/product/index3_1.html, May 28, 2012. Micronics Japan CO., LTD. Technological Column, section 1. "What is the probe card?".
Charles E. Stroud, Chapter 1 of "A Designer's Guide to Built-In Self-Test", (C)2002 Kluwer Academic Publishers, ISBN: 0-306-47504-9 / 1-4020-7050-0.

(Continued)

*Primary Examiner* — Guerrier Merant
(74) *Attorney, Agent, or Firm* — Yi-Shan Yang

(57) ABSTRACT

A system for testing electronic circuits is configured to receive a test signal and an ideal response signal and output a test result signal. The system for testing electronic circuits includes a circuit portion to be tested, a comparator and a comparison result recorder. The circuit portion to be tested receives a test signal from a test instrument, and outputs a system response signal. The comparator receives the system response signal from the circuit portion to be tested and receives an ideal response signal from the test instrument. Then, the comparator outputs a comparison result according to the system response signal and the ideal response signal. The comparison result recorder receives and records the comparison result. The comparison result recorder may record comparison results within a period of test time. The test instrument can obtain a record of the comparison results from the comparison result recorder.

20 Claims, 21 Drawing Sheets

(56) References Cited

OTHER PUBLICATIONS

Sematech Dictionary of Semiconductor Terms, Rev. 5.0 Online Version, Copyright 2012, Semitech, Inc.

Dave Ross Blog. 2012. http://www.ele-tech.com/html/tag/signal.

Diamondx Test System—The Next Generation Test Paltform. 2013. http://www.ltxc.com/xweb.nsf/published/diamondx?Open.

* cited by examiner

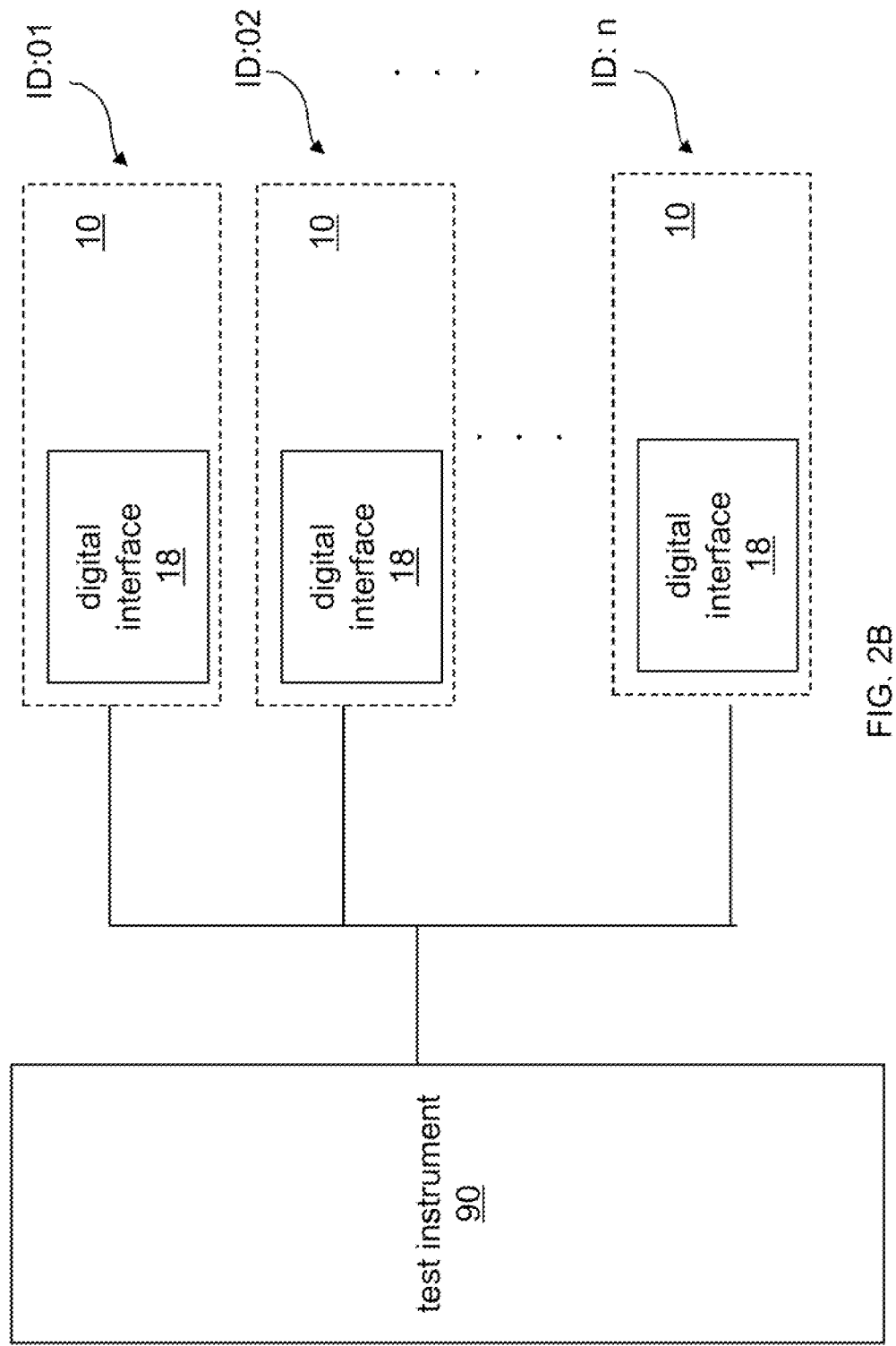

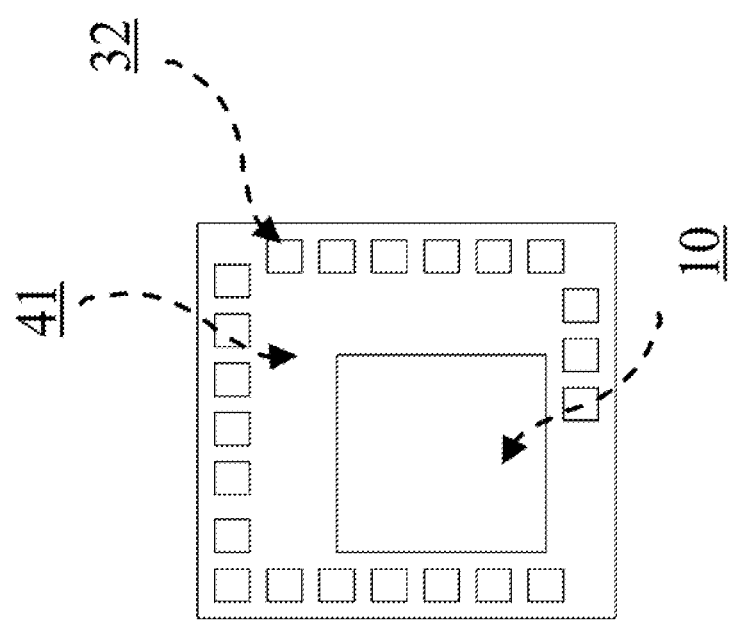

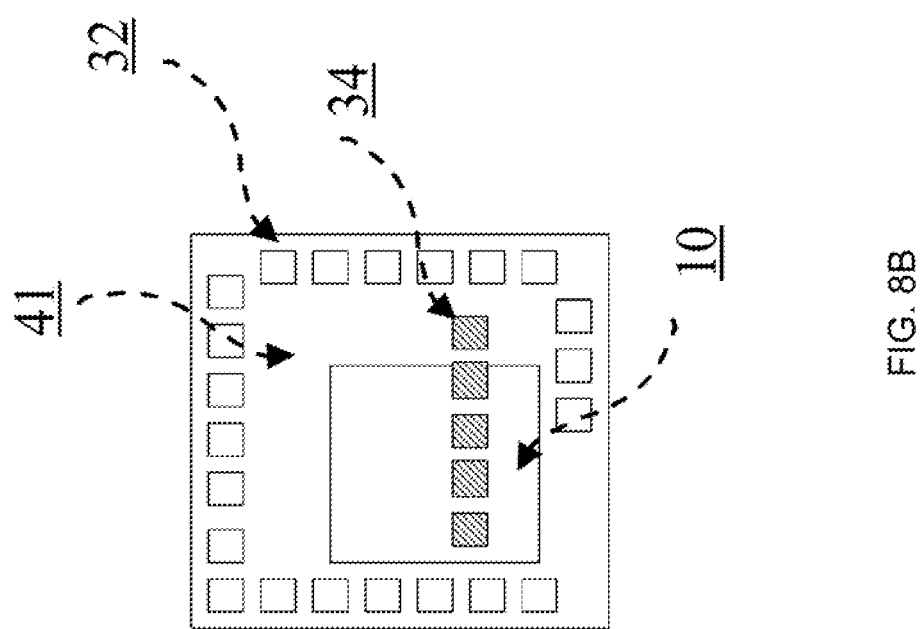

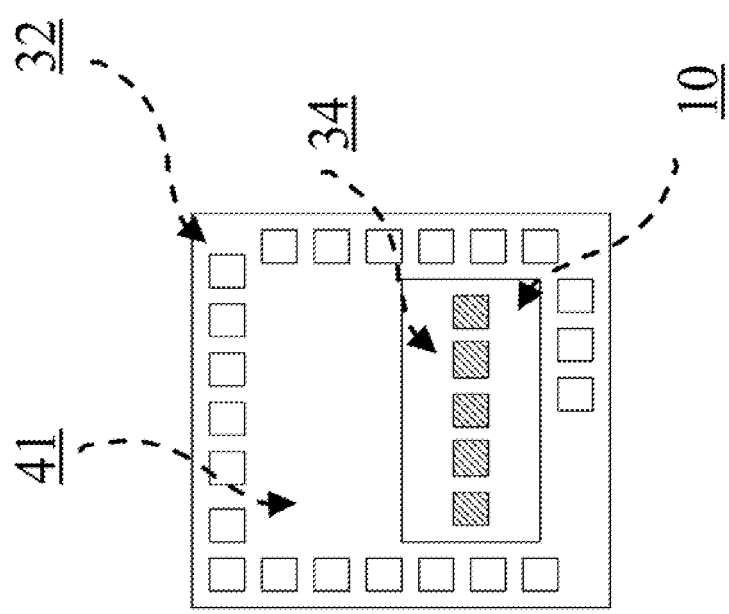

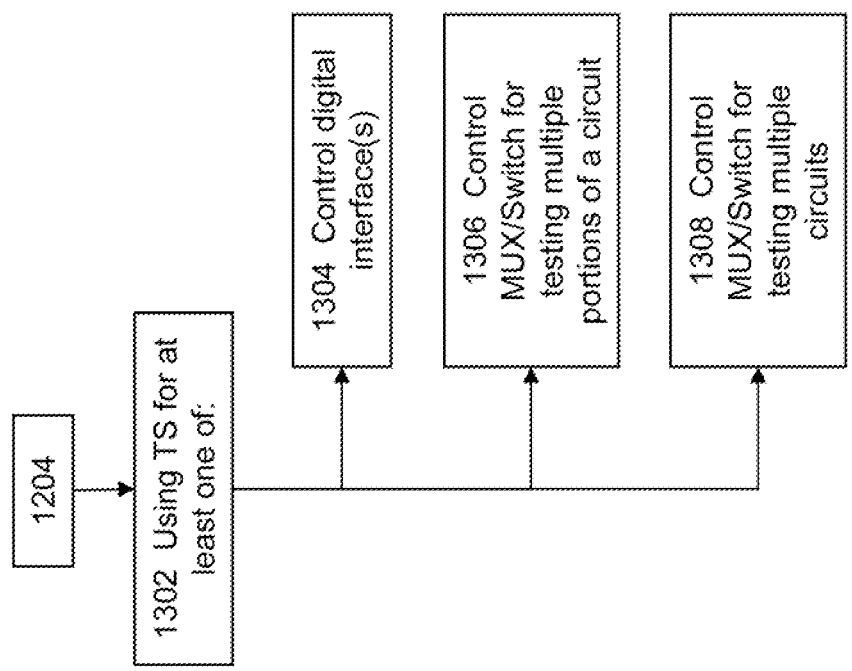

METHODS AND SYSTEMS FOR TESTING ELECTRONIC CIRCUITS

FIELD OF THE INVENTION

The present invention relates to a circuit and method for testing the same, and more particularly to an error comparison circuit and method for testing the same.

BACKGROUND OF THE INVENTION

Integrated circuits have been in existence for around half a century. With the development of technologies, various integrated circuit technologies have been proposed. Chips fabricated with integrated circuits have been widely applied in various different products.

During the chip design or manufacturing process, chips may fail due to various different reasons. As a result, in the chip manufacturing process, chips need to be tested. If it is determined that a chip fails during any stages of the manufacturing process, subsequent production processes of the chip are stopped so as to prevent the manufacturing cost from increasing due to wasted labor.

Wafer testing is usually conducted by conducting probe-test on each chip on a wafer. A test instrument uses a test probe to contact bonding pads on the chip and transmit a particular test signal to the chip under test. The test instrument receives a system response from the chip and compares the system response with an ideal response.

However, it takes test time for the test instrument to transmit the particular test signal to and read the response from the chip under test. The greater the number of chips the need to be tested on a wafer is, the more the time will be spent in testing the chips on the wafer. The use of parallel testing can reduce the total test time. In addition, the test instrument requires signal channels for transmitting signals to and receiving signals from the chips. For a common setting of parallel testing, substantially identical or similar data transmitted into each chip under test, and such substantially identical or similar data may be transmitted in parallel. Nonetheless, the reception of particular signals requires each chip under test be configured with a separate channel. In many cases, the number of signal channels of the test instrument limits the maximum number of chips that may be tested in one parallel test.

SUMMARY OF THE INVENTION

One or more embodiments are directed at a generic and reusable system for testing electronic circuits and method for the same. The system for testing electronic circuits is configured to receive a test signal and an ideal response signal and transmit a test result signal. The system for testing electronic circuits comprises a circuit portion to be tested, a comparator, and a comparison result recorder in the single embodiments or in some embodiments. The system for testing electronic circuits and method are generic in the sense that the same method may be applied to testing of various different electronic circuits, such as digital circuits, analog circuit, mixed-signal circuits, or a memory device. The same architecture or substantially the same architecture of the system for testing electronic circuits may also be used or even embedded in various different electronic circuits such as an analog circuit, a digital circuit, a mixed-signal circuit, or a memory device with very little or minimal modifications without departing from the spirit of various embodiments. It shall be noted that memory devices are generally considered as digital circuits. Nonetheless, the tests for memory devices are somewhat different from other digital circuits, and thus the Application makes such distinctions.

The circuit portion of the chip under test to be tested receives a test signal from a test instrument and outputs a system response signal in the single embodiment or in some embodiments. One of ordinary skill in the art certainly understands that the terms "a test signal" and "a system response signal", although both are represented in singular form, represent one or more test signals transmitted into and one or more response signals received from the chip under test.

The comparator receives the system response signal from the circuit portion to be tested and receives an ideal response signal from the test instrument. Then, the comparator outputs a comparison result based at least in part the system response signal and the ideal response signal in the single embodiments or in some embodiments.

The comparison result recorder receives and records the comparison result. In one or more embodiments, the comparison result recorder may record whether or not an error occurs to the circuit portion to be tested within a period of test time. In one or more embodiments, the comparison result recorder stores the comparison result and outputs a test result signal to the test instrument according to the comparison result.

In addition or in the alternative, one or more embodiments of the invention further provide an system for testing electronic circuits, comprising, a comparator, and a comparison result recorder, in which the circuit portion to be tested comprises a memory. In addition to receiving a test signal and an ideal response signal, the system for testing, electronic circuits is further configured to receive a control signal. The control signal may be used for controlling to process of storing to or reading from the memory. In the single embodiment or in some embodiments, the system for testing electronic circuits may further comprise a circuit portion to be tested.

In addition, in the single embodiment or in some other embodiments, the system for testing electronic circuits may further comprise a digital interface. The digital interface may be used for transferring a test signal to the circuit portion to be tested, to transfer an ideal response signal to the comparator, and/or to receive a test result signal from the comparison result recorder.

Moreover, one or more embodiments further disclose that the comparison result stored in the comparison result recorder of the system for testing electronic circuits may be transmitted to the test instrument after the test instrument initiates a read request.

One or more embodiments, further disclose that the entire system for testing electronic circuits or a portion thereof may be disposed on a wafer or on any other types of semiconductor substrates (hereinafter a semiconductor substrate). That it, some or all of the circuit portion to be tested, the comparator, and the comparison result recorder are located on a semiconductor substrate.

Furthermore, one or more embodiments provide a method for testing an electronic circuit on a semiconductor substrate, which comprises transferring a test signal to a circuit under test, transferring an ideal response signal to the circuit under test, and obtaining a test result from the circuit under test.

Through the system for testing electronic circuits and the method for testing the circuit under test provided by various embodiments, the test time and the number of signal channels required by the test instrument may be greatly reduced.

BRIEF DESCRIPTION OF THE DRAWINGS

FIGS. 2A-B illustrate high level diagrams for system for testing electronic circuits in some embodiments.

FIGS. 8A-E illustrate schematic configurations of various systems for testing electronic circuits on semiconductor substrates.

FIG. 13 illustrates further details of an act of using the test signal(s) for various purposes in some embodiments.

DETAILED DESCRIPTION OF THE INVENTION

The detailed features and advantages of various embodiments are described below in greater details by way of examples, the contents of the detailed description are disclosed in a manner to enable those skilled in the art to understand and to make and use the technical contents and any slight or obvious variations contained herein various embodiments. Based upon the contents of the specification, the claims, and the drawings, those skilled in the art can easily understand the relevant objectives and advantages. The following embodiments are intended to illustrate and explain various embodiments in further detail by way of examples and/or illustrations but do not intended to limit the scope of the invention or the claims in any way.

Figure 1A:
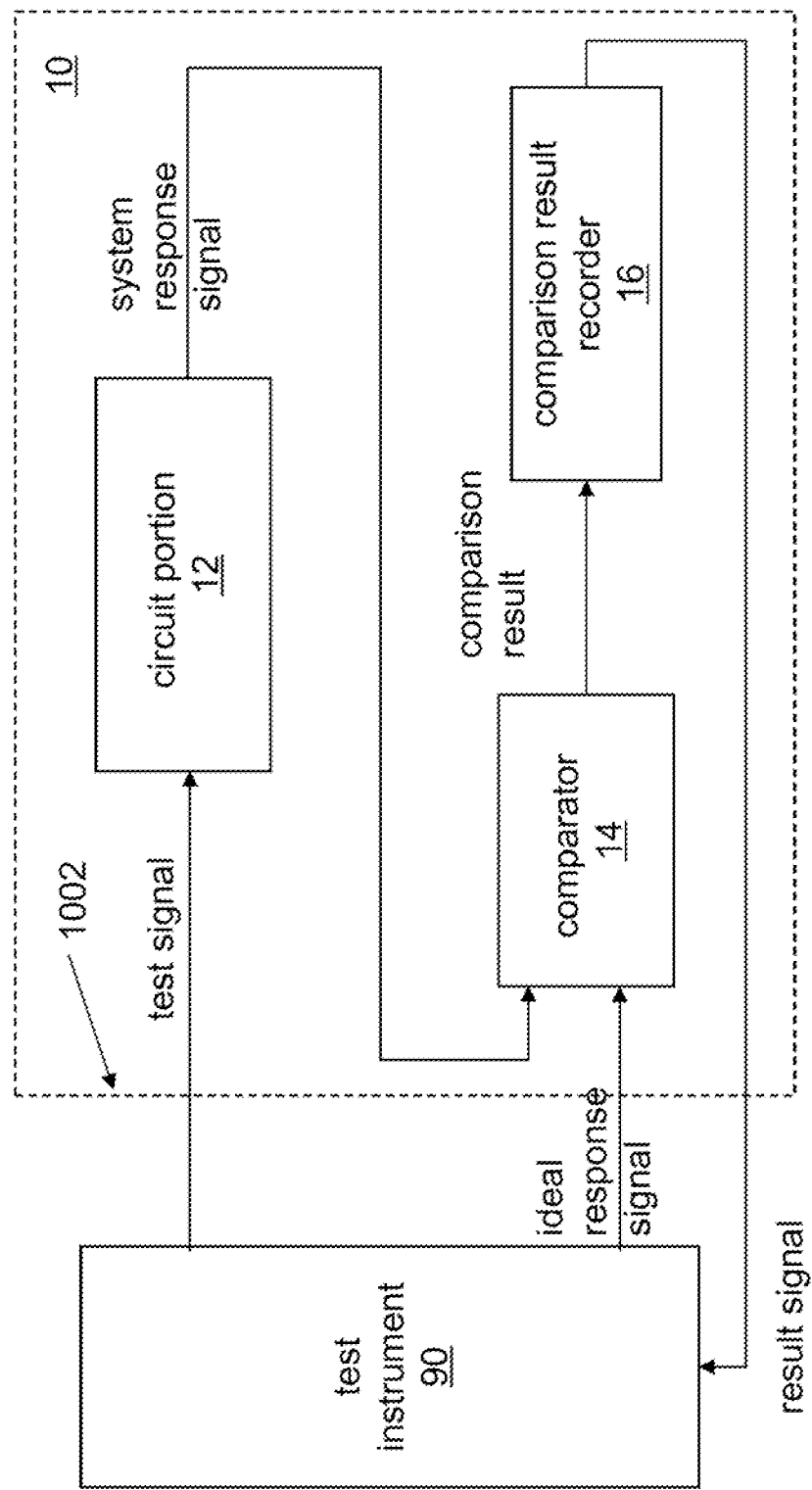
FIGS. 1A-C illustrate high level diagrams for system for testing electronic circuits in some embodiments.

FIG. 1A illustrates a system block diagram of a first embodiment of the invention. In the first embodiment, a system for testing electronic circuits 10 is provided. The system for testing electronic circuits 10 is configured to receive a test signal and an ideal response signal from a test instrument 90, such as the Agilent® 9300 automatic test equipment or the Credence® Diamond series, Sapphire series, X-series, or ASL series Testers, and output a test result signal. In some embodiments where the system response signal is determined to be different from the ideal response signal, this mismatch between the two signals indicates that there may have existed an error in the circuit under test. On the other hand, the fact that the system response signal perfectly matches the ideal response signal does not always result in the conclusion that the system response signal is correct in some embodiments. Whether or not the match between the two signals indicates that the circuit under test is functioning as designed depends upon the completeness of the response signal. The system for testing electronic circuits 10 comprises a circuit portion 12 that is to be tested, a comparator 14, and a comparison result recorder 16. In some embodiments, the system for testing electronic circuits 10 comprises the comparator 14 and the comparison recorder 16 but not the circuit portion 12 as indicated by the imaginary boundary 1002 that excludes the circuit portion 12 from the system for testing electronic circuits 10.

The circuit portion 12 to be tested may comprise a digital circuit in the first embodiment or in some embodiments. In the first embodiments or in some other embodiments, the circuit portion 12 to be tested may comprise a mixed-signal circuit which further comprises a digital circuit. The circuit portion 12 to be tested may comprise a memory circuit in the first embodiment or in some embodiments. The circuit portion 12 to be tested may also comprise an analog circuit. In the first embodiment or in some embodiments where the circuit portion 12 to be tested comprises a digital circuit is illustrated for explanation and illustration purposes. In one embodiment, the circuit portion 12 to be tested comprises a memory circuit. In another embodiment, the circuit portion 12 to be tested comprises an analog circuit.

In this embodiment or in some embodiments, the circuit portion 12 to be tested comprises a digital circuit, and the circuit portion 12 to be tested receives a test signal from the test instrument 90. The test signal may comprise a serial digital signal or a test vector; the test signal is not, however, limited thereto, and any signal that may be input to the circuit portion to be tested may be used as the test signal. After the circuit portion 12 to be tested receives the test signal, the circuit portion 12 to be tested outputs one or more system response signals in response to the test signal generated through one or more operations in the circuit portion 12 to be tested. One of ordinary skill in the art will clearly understand that the system response signals vary and are generated in response to the test signal.

The comparator 14 receives the system response signal from the circuit portion 12 to be tested and receives an ideal response signal from the test instrument 90. The ideal response signal comprises a system response signal generated by the circuit portion 12 to be tested after receiving the test signal when the circuit portion 12 to be tested is error-free in the first embodiment or in some embodiments. In the single embodiment or in some embodiments, the ideal response signal may also be referred to as an error-free system response signal. One of ordinary skill in the art will clearly understand that the ideal response signal may vary and comprises a signal that is expected to be generated by the circuit portion under test 12 in accordance with what the design of the circuit portion under test 12 is designed or intended to generate in response to the test signal in the signal embodiment or in some embodiments. The comparator 14 outputs a comparison result based at least in part upon the system response signal generated by the circuit portion 12 to be tested and the ideal response signal.

When the system response signal is determined to be identical to the ideal response signal, the comparison result output by the comparator 14 comprises a "correct" signal which may take many forms such as a unique signal representing the correctness of the comparison result or a bit stream which corresponds to various status of the comparison results. One of ordinary skill in the art understands that the comparison result output may also take other forms for the same purpose, and these other forms are deemed obvious variations and are thus within the scope of the disclosure of the Application. When the system response signal is determined to be different from the ideal response signal, the comparison result output by the comparator 14 comprises an "error" signal, which may also take various forms to indicate the that the circuit portion under test 12 generates an unexpected signal in response to the test signal.

The comparison result recorder 16 receives and records the comparison result in the single embodiment or in some embodiments. The comparison result recorder 16 may record whether an error occurs to the circuit portion 12 to be tested within a period of test time based at least in part upon the comparison results. The comparison result recorder 16 stores the comparison results in a computer or machine readable storage medium, for example but not limited to, a volatile or non-volatile memory, and outputs a test result signal to the test instrument 90 based at least in part upon the comparison results. It shall be noted that the terms "computer or machine readable storage medium" and "memory" for various storage or access purposes are used interchangeably throughout the specification to indicate any tangible storage medium that is used for storing information or data in one or more desired formats and is characterized by being able to be accessed by general or special purpose computers or machines such as electronic circuit test equipment.

Based at least in part upon the system for testing electronic circuits 10, the system for testing electronic circuits 10 may output the final test result signal to the test instrument 90 in the single embodiment or in some embodiments. That is, the test instrument 90 may read the final test result signal, which indicates the comparison results from the comparator 14 or the comparison result recorder 16 instead of the system response signals from the error comparison circuit or system 10. In these embodiments, the amount of data or information received by the test instrument 90 may be greatly reduced by using the system for testing electronic circuits 10. In some embodiments, the system for testing electronic circuits 10 may record the test result of each test, whether the test succeeds or fails. In some embodiments, the system for testing electronic circuits 10 only records the test result of one or more tests when the one or more tests fail. In some embodiments, the system for testing electronic circuits 10 records whether the recorded test fails or succeeds. In some other embodiments, the system for testing electronic circuits 10 records not only whether the recorded test fails or succeeds but also the location(s) of successful or failed, recorded test. In one embodiment, the system for testing electronic circuits 10 is implemented to achieve various intended functions as designed without comprising a test pattern generator. In this embodiment or in some other embodiments, the test patterns for the circuit portion 12 are generated by the test instrument 90.

Figure 1B:
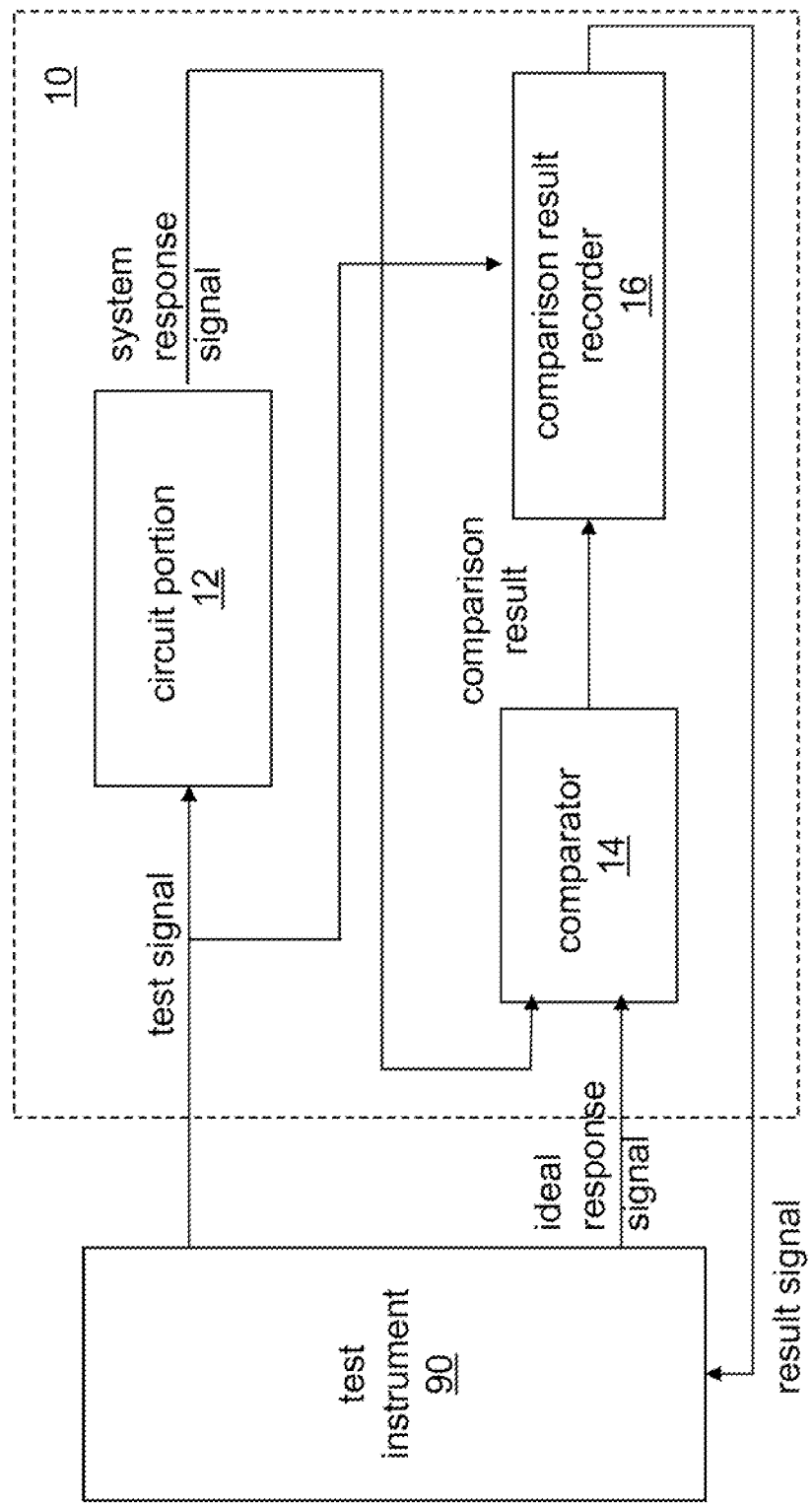
Figure 1C:
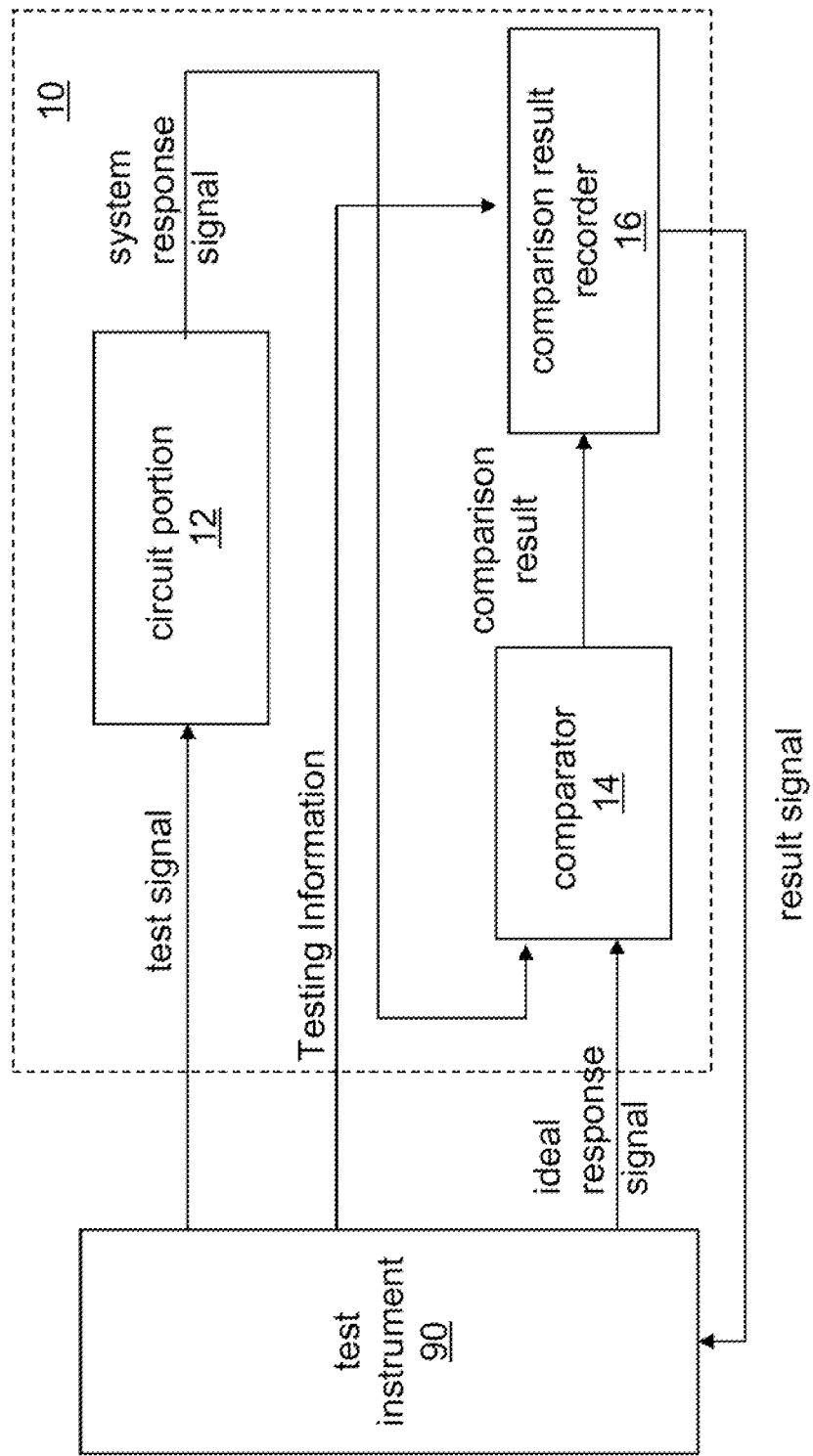

In one or more embodiments, the comparison result recorder 16 not only records whether an error has occurred but may also record the time when the error occurred or where the error occurred. In these embodiments, the comparison result recorder 16 receives the comparison result from the comparator 14 and the test signal or information about the test signal from the test instrument 90 as illustrated in FIG. 1B. The system for testing electronic circuits 10 may determine or identify the correlation between the test signal and the comparison result. The correlation between the test signal and the comparison result may be used to, for example but not limited to, determine where or when the comparison result is generated, the location or address of the portion of the circuit under test that results in the generation of the test signal, at which stage or point in the test the test signal is generated, etc. Such correlation may be provided for further improving, for example, the yield. For example, the recorded information, such as whether or where an error has occurred or when or at what particular stage of test the error occurred, etc., may be used to modify the manufacturing process or the corresponding mask design(s) or to modify the design of the electronic circuit under test so as to improve yield or performance of the electronic circuit under test In some embodiments as illustrated in FIG. 1C, the comparison result recorder 16 receives testing information instead of the test signal from the test instrument 90 such that the system for testing electronic circuits 10 may determine or identify the correlation between the test condition and the comparison. As illustrated in FIG. 1B, the correlation between the test signal and the comparison result may be used to, for example but not limited to, determine where or when the comparison result is generated, the location or address of the portion of the circuit under test that results in the generation of the test signal, at which stage or point in the test the test signal is generated, etc. Unlike the system for testing electronic circuits as illustrated in FIG. 1B, the comparison result recorder 16 receives the testing information instead of the test signal because the test signal may not carry sufficient information to adequately determine the desired correlation between the testing condition(s) and the test results. The testing condition may comprise, for example but not limited to, temperatures of the respective tests, voltages, currents, locations or addresses of the portion of the circuit under test, etc.

In one or more embodiments, the comparison result recorder 16 may identify a location that possibly causes the error based at least in part upon a portion of the test signal and record the time when the error occurred. For example, the recorder 16 may record the clock cycles or signals when an error occurs by, for example, counting the clock cycles. The designer or engineer knows what test is performed at a specific clock cycle and may then correlate the timing information to a specific portion of the circuit under test.

In one or more embodiments, the comparison result recorder 16 may know a position where the error occurred or may have occurred in the circuit portion under test from the test instrument 90 and record the time when the error occurred.

Figure 2A:
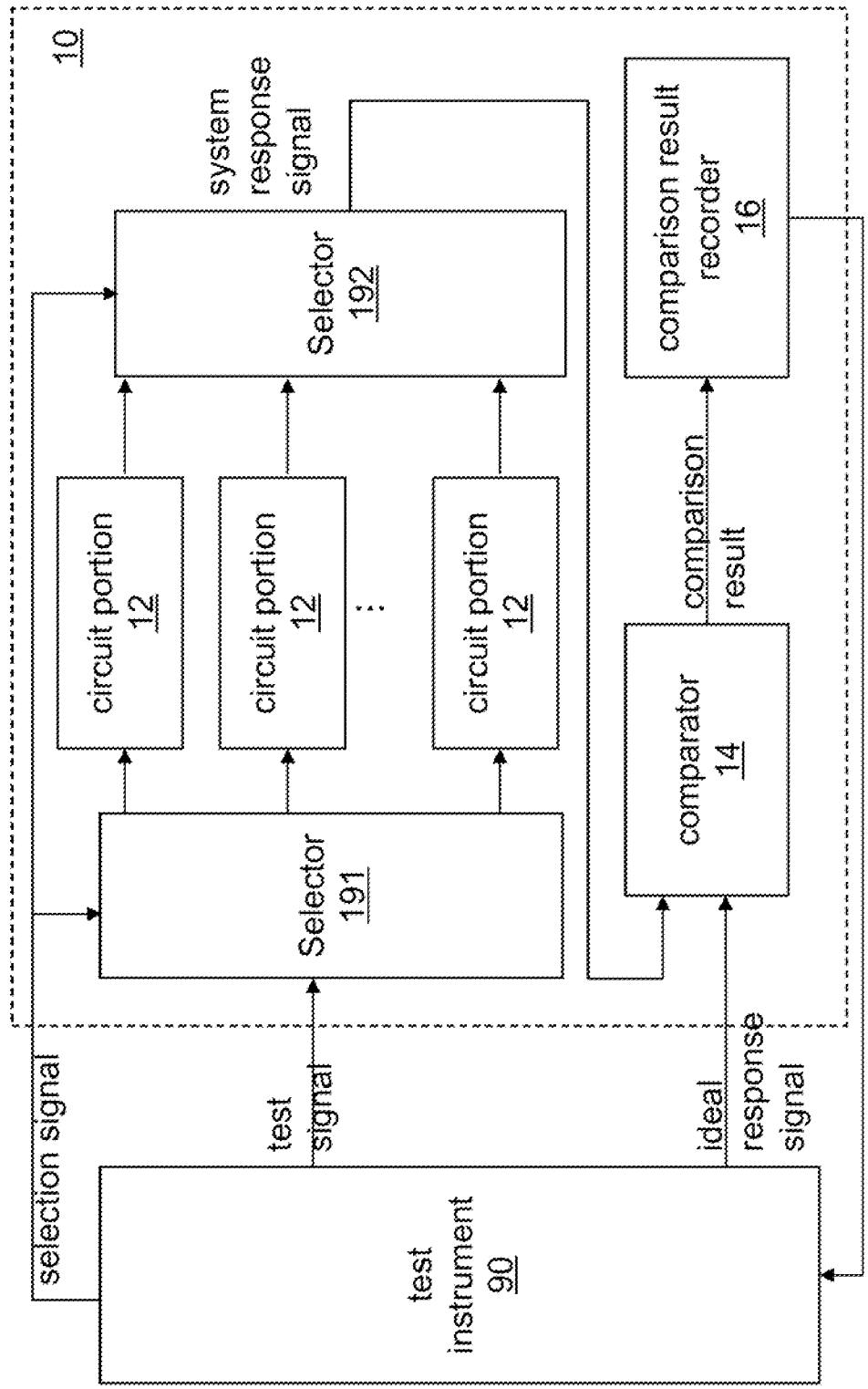

The first embodiment shows only the testing of a single circuit portion 12 to be tested for explanation and illustration purposes, various embodiments of the Application are not limited thereto. FIG. 2A illustrates a system block diagram of a second embodiment of a system for testing electronic circuits 10. In this embodiment, the system for testing electronic circuits 10 comprises a plurality of circuit portions 12 to be tested, a selector 191, a selector 192, a comparator 14, and a comparison result recorder 16.

In the single embodiment or in some embodiments, the selector 191 comprises at least one input port and a plurality of output ports. The selector 191 may selectively connect the input port to one of the plurality of output ports. The input port of the selector 191 is connected to the test instrument 90, and the plurality of output ports of the selector 191 are respectively connected to the plurality of circuit portions 12 to be tested. The plurality of circuit portions 12 to be tested may then be connected to the selector 192 on a multiple-to-one basis. The selector 192 comprises a plurality of input ports and at least one output port in the single embodiment or in some embodiments. The selector 192 may selectively connect one of the input ports to the output port in the single embodiment or in some embodiments. The output port of the selector 192 may be connected to the comparator 14. The selector 191 may be configured for receiving a test signal and a selection signal. The selector 192 may also be configured for selectively transferring the test signal to one of the circuit portions 12 to be tested based at least in part upon the selection signal. The selector 192 may be configured to transfer a system response signal from the plurality of circuit portions 12 to be tested to the comparator 14.

In the single embodiment or in some embodiments, the error comparison circuit 10 may test the plurality of circuit portions 12 to be tested.

In one or more embodiments, the system for testing electronic circuits 10 may be disposed on a semiconductor substrate. Disposing the system for testing electronic circuits 10 on a semiconductor substrate will be described in greater details in subsequent part of the Application.

In one or more embodiments, the system for testing electronic circuits 10 may be connected to the test instrument 90 through one or more digital interfaces 18 as illustrated in FIG. 2B. The digital interface 18 may comprise, for example but not limited to, an inter-integrated circuit (I2C), a serial peripheral interface, or any other interfaces (hereinafter digital interface) suitable for interfacing between the test instrument 90 and the system for testing electronic circuits 10.

In one or more embodiments, the system for testing electronic circuits 10 may have its own unique ID which may use, for example, one or more bits to uniquely identify the corresponding system for testing electronic circuits 10. For example, the ID may comprise a four-tuple with, for example, identifications of 01, 02, 03, and 04 or 00, 01, 10, 11 in some embodiments. During a test with such an ID, the system for testing electronic circuits 10 may probe four circuits under test at once. Moreover, if we have eight sets of circuits under test to be tested with the four-tuple ID, the system for testing electronic circuits 10 may probe the eight circuits under test in two sets. In some embodiments, the system for testing electronic circuits 10 may further comprises a multiplexer (MUX) or a switch that is disposed between multiple sets of the circuits under test and the system for testing electronic circuits 10 to determine which set the system for testing electronic circuits 10 is reading the signals from.

In various embodiments, the system for testing electronic circuits 10 may comprise an n-tuple ID, wherein n is an integer. In one or more embodiments, a plurality of the system for testing electronic circuits 10 having their own IDs is connected in parallel through a digital interface. In one or more embodiments, the plurality of the system for testing electronic circuits 10 connected in parallel through the digital interface receives a test signal, and an ideal response signal may be transmitted to the plurality of the error comparison circuits at substantially the same time. One of ordinary skill in the art will understand that there may exist certain lag in transmission of two signals due to various reasons such as timing delay despite the two signals are intended or designed to be transmitted at exactly the same time. In some embodiments, each system for testing electronic circuits 10 records whether an error occurs. After the test is completed, the test instrument 90 respectively reads a test result record of the comparison result recorder 16 in each error comparison circuit 10 by using, for example, the circuit IDs.

Figure 3:
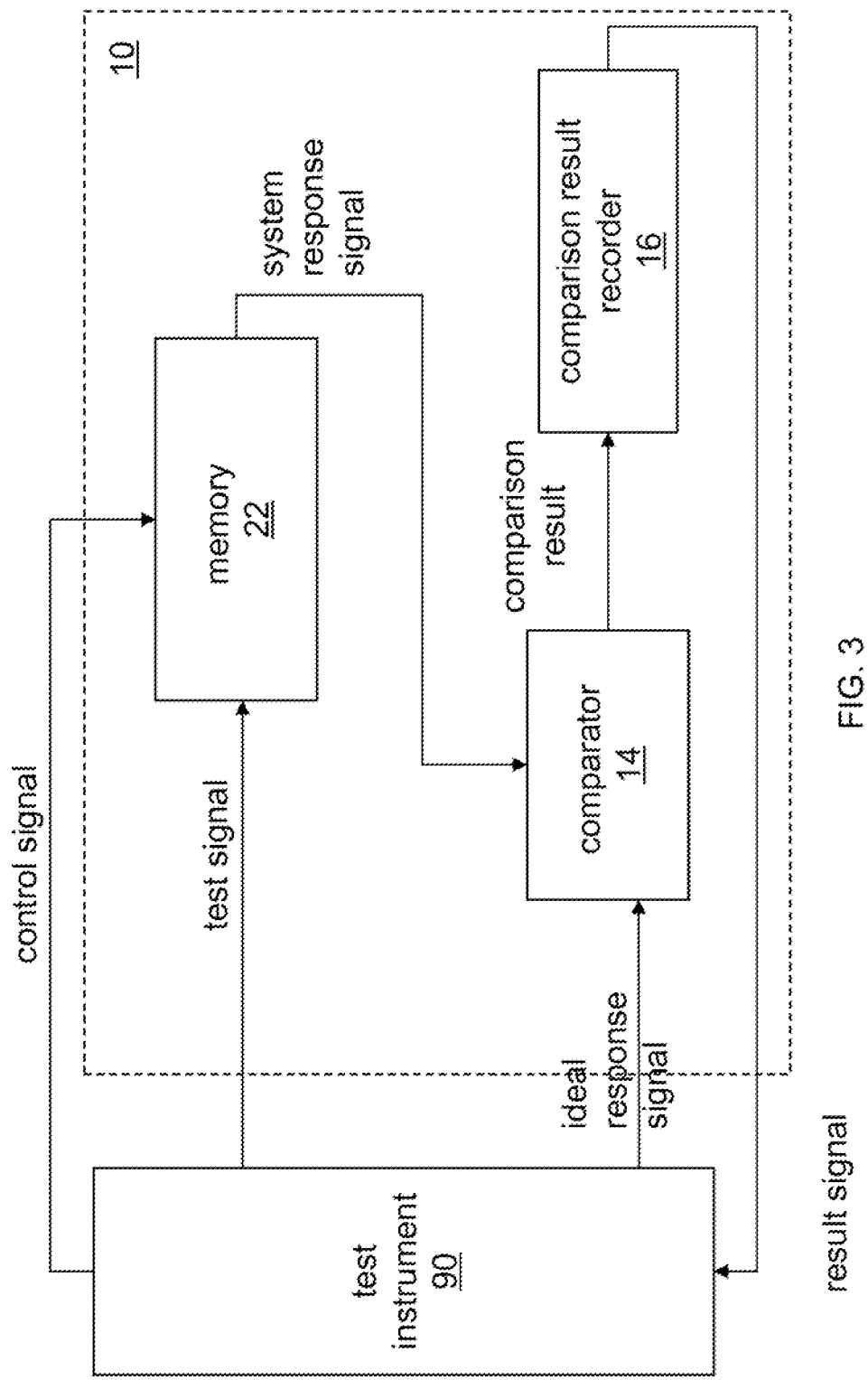
FIG. 3 illustrates a high level diagram for the system for testing electronic circuits.

In addition, in one or more embodiments, the circuit portion 12 to be tested comprises a memory circuit. FIG. 3 illustrates a system block diagram of a third embodiment. In the third embodiment, the system for testing electronic circuits 10 comprises a memory 22, a comparator 14, and a comparison result recorder 16. In addition to receiving a test signal and an ideal response signal, the system for testing electronic circuits 10 may further be configured to receive a control signal. The control signal may be used for controlling storing to or reading from the memory 22 in the single embodiment or in some embodiments.

In some embodiments where the control signal comprises a signal to store the test signal, the test instrument 90 may transfer the test signal to the memory 22, and the memory 22 may store the test signal therein. In the single embodiment or in some embodiments where the control signal comprises a signal to read the test signal, the memory under test 22 may receive a test signal and, in response to a control command, output the test signal to the comparator 14 as a system response signal.

Figure 4:
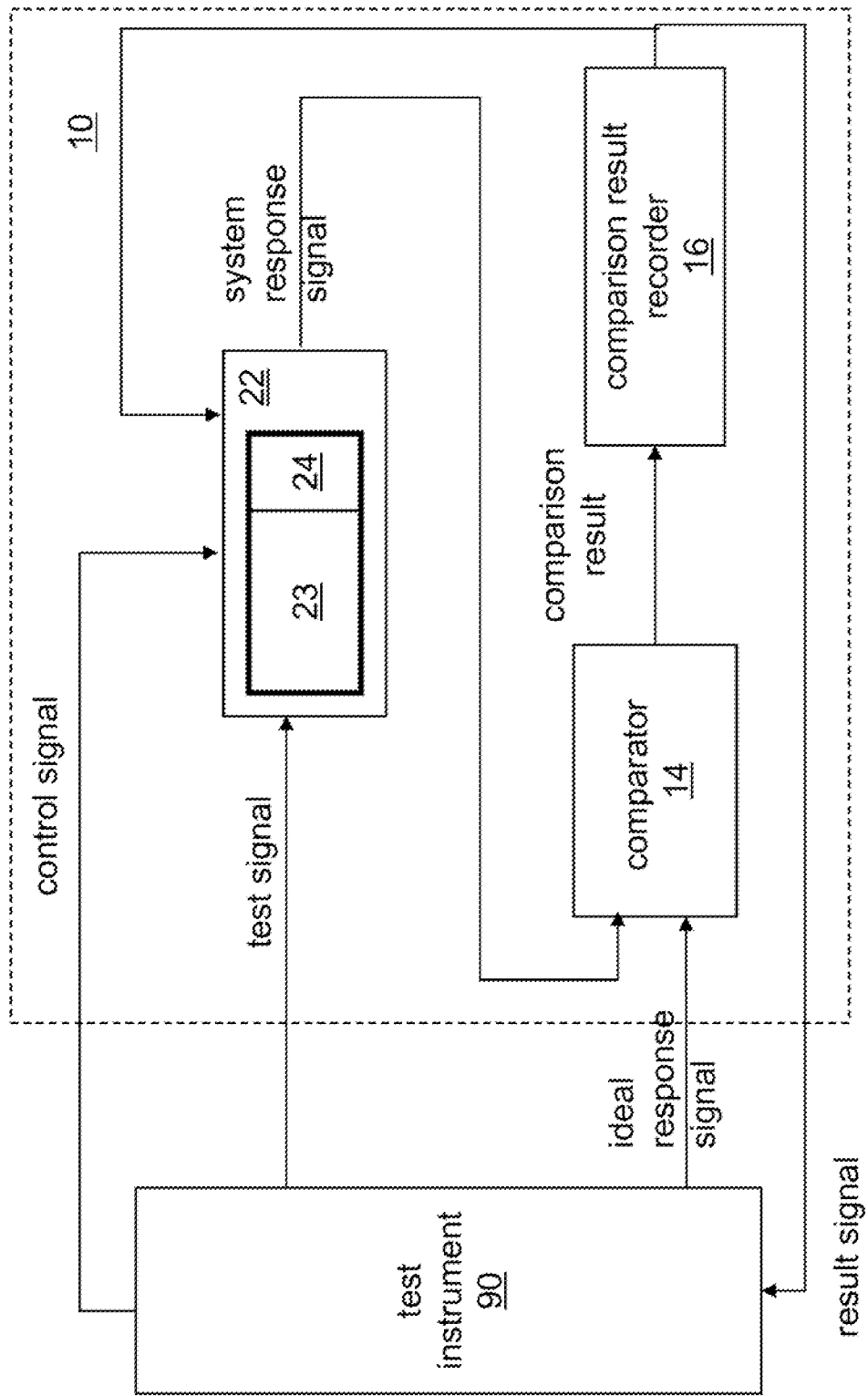
FIG. 4 illustrates a high level diagram for the system for testing electronic circuits.

In one or more embodiments, the memory 22 may comprise a plurality of memory cells. FIG. 4 illustrates a system block diagram of a fourth embodiment. The memory cells may be further divided into one or more primary memory cells 23 and one or more redundancy memory cells 24 in the single embodiment or in some embodiments. In some embodiments, in addition to controlling whether to store to or to read from the memory 22, the control signal may also be used for selecting one or more controlled memory cells for the corresponding controlling action. That is, the control signal may comprise at least one or more status signals (signals to store/read) and one or more cell numbers for the corresponding one or more status signals. In some embodiments, each cell number corresponds to one primary memory cell 23.

In the fourth embodiment, the comparison result recorder 16 may feed back a replacement signal to the memory 22. In the single embodiment or in some embodiments, the comparison result recorder 16 records that an error occurs to a primary memory cell 23, the primary memory cell 23 where the error occurs may be replaced by one of the redundancy memory cells 24. For example, when it is determined that a memory cell in the primary memory cells 23 corresponding to a cell number fails, the cell number may be changed to correspond to a memory cell in the one or more redundancy memory cells 24. In this manner, the failed memory cell may be replaced by a good memory cell, and thus the memory 22 may still function as intended during the testing of the memory 22 without performing any further testing or configuration to identify and replace the faulty memory cell(s).

Because the number of the redundancy memory cells 24 may be limited, the memory 22 may not be used normally if the number of failed primary memory cells 23 exceeds the number of the redundancy memory cells 24. That is, in this embodiment, the comparison result recorder 16 stores the number(s) or other means of identification of the redundancy memory cell(s) 24 in advance. When the number of replacement signals in a comparison result is greater than the number of the redundancy memory cells 24, the system for testing electronic circuits may determine that the memory 22 may not be used as intended. Accordingly, the comparison result recorder 16 records that the memory 22 has failed, or that the memory 22 may only be used as a lesser capacity memory.

In one or more embodiments, the comparison result recorder 16 may record a position in the primary memory cells 23 where an error occurs. After the one or more primary memory cells 23 in a memory cell are tested, the test instrument 90 may read data in the comparison result recorder 16, and determine, through one or more operations, how to use the redundancy memory cells 24 to replace the failed primary memory cells 23 in the memory cell in the single embodiment or in some embodiments. In these embodiments, the test instrument 90 writes the result into one or more lines of the memory 22. In the single embodiment or in some embodiments, the one or more lines may comprise one or more word lines, one or more bit lines, or any combination thereof. Then, a next memory cell may be tested until all the memory cells in the memory 22 have been tested. If the test instrument 90 determines that, during the testing of a memory cell, the one or more redundancy memory cells 24 may not be used to replace the failed primary memory cells 23 in the memory cell, the test instrument 90 may further determine that the memory 22 has failed for the intended purpose, or that the memory 22 may only be used for some lesser capacity memory.

In one or more embodiments, the memory 22 comprises a non-volatile memory so as to record a mode in which the one or more redundancy memory cells 24 are used to replace the failed primary memory cells 23.

In one or more embodiments, the one or more redundancy memory cells 24 may be located beside one or more word lines of the primary memory cells 23 for replacing one or more memory elements located on the same one or more word line.

In one or more embodiments, the redundancy memory cells 24 may be located beside one or more bit lines of the one or more primary memory cells 23 for replacing one or more memory elements located on the same one or more bit lines.

Figure 5:
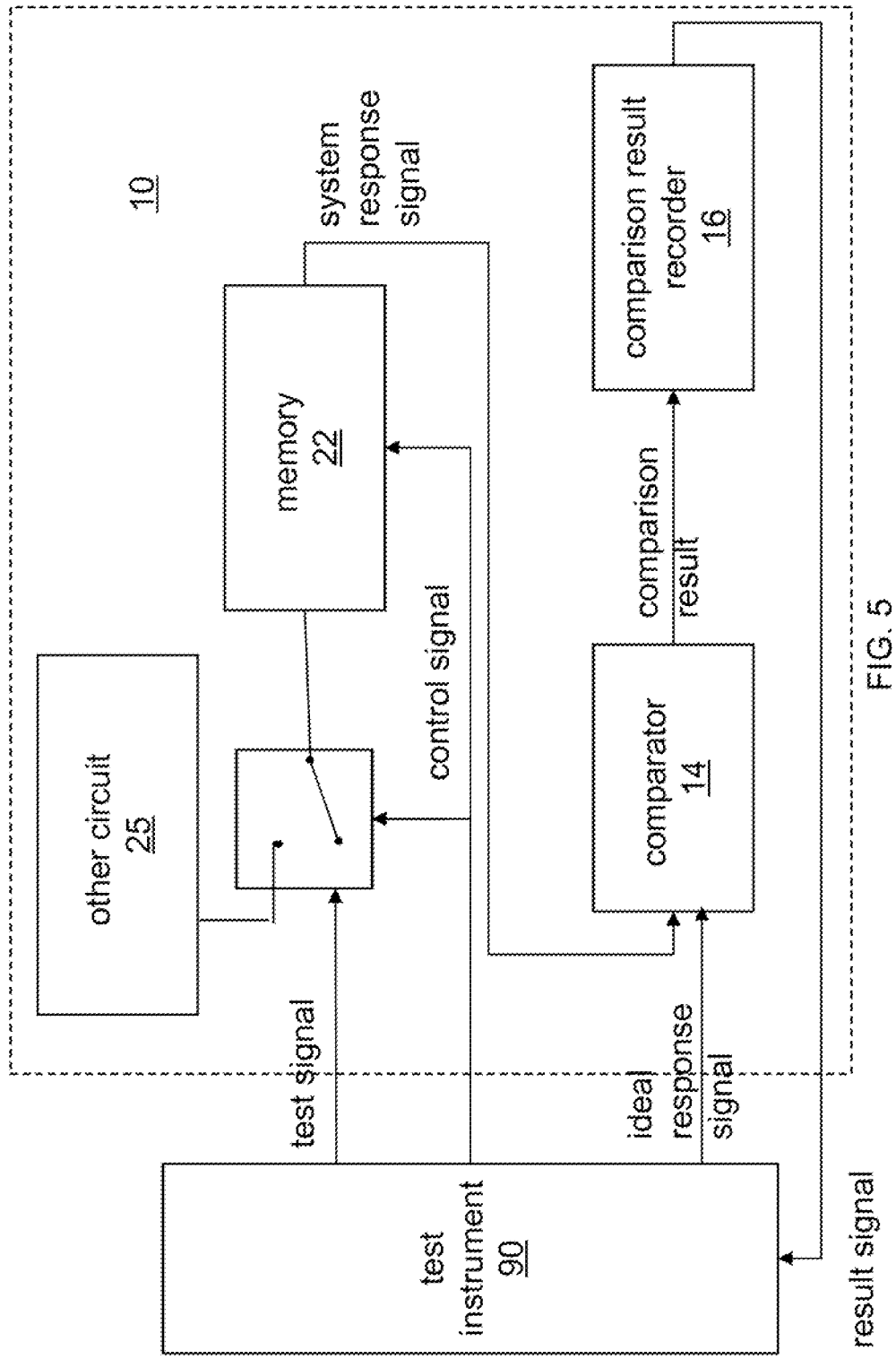
FIG. 5 illustrates a high level diagram for the system for testing electronic circuits.

FIG. 5 illustrates a system block diagram of a fifth embodiment. In the fifth embodiment, the system for testing electronic circuits 10 comprises a memory 22, other circuits 25, a comparator 14, a comparison result recorder 16, and a switch 26.

In the single embodiment or in some embodiments, the memory 22 may be electrically connected to the other circuits 25 to be tested through the switch 26. The switch 26 receives a switching signal and selectively transfers a test signal to the memory 22. In addition or in the alternative, the switch 26 may electrically connects the other circuits 25 to the memory 22 according to the switching signal.

In some embodiments where the circuit is in a normal working mode, the other circuits 25 may be connected to the memory 22 through the switch 26, and the other circuits 25 and the memory 22 may form a complete circuit. In the single embodiment or in some embodiments where the memory 22 needs to be tested, the memory 22 may be connected to the test instrument 90 through the switch 26. The test instrument 90 transfers a test signal and a control signal to the memory 22 through the switch 26 and tests the memory 22.

Figure 6:
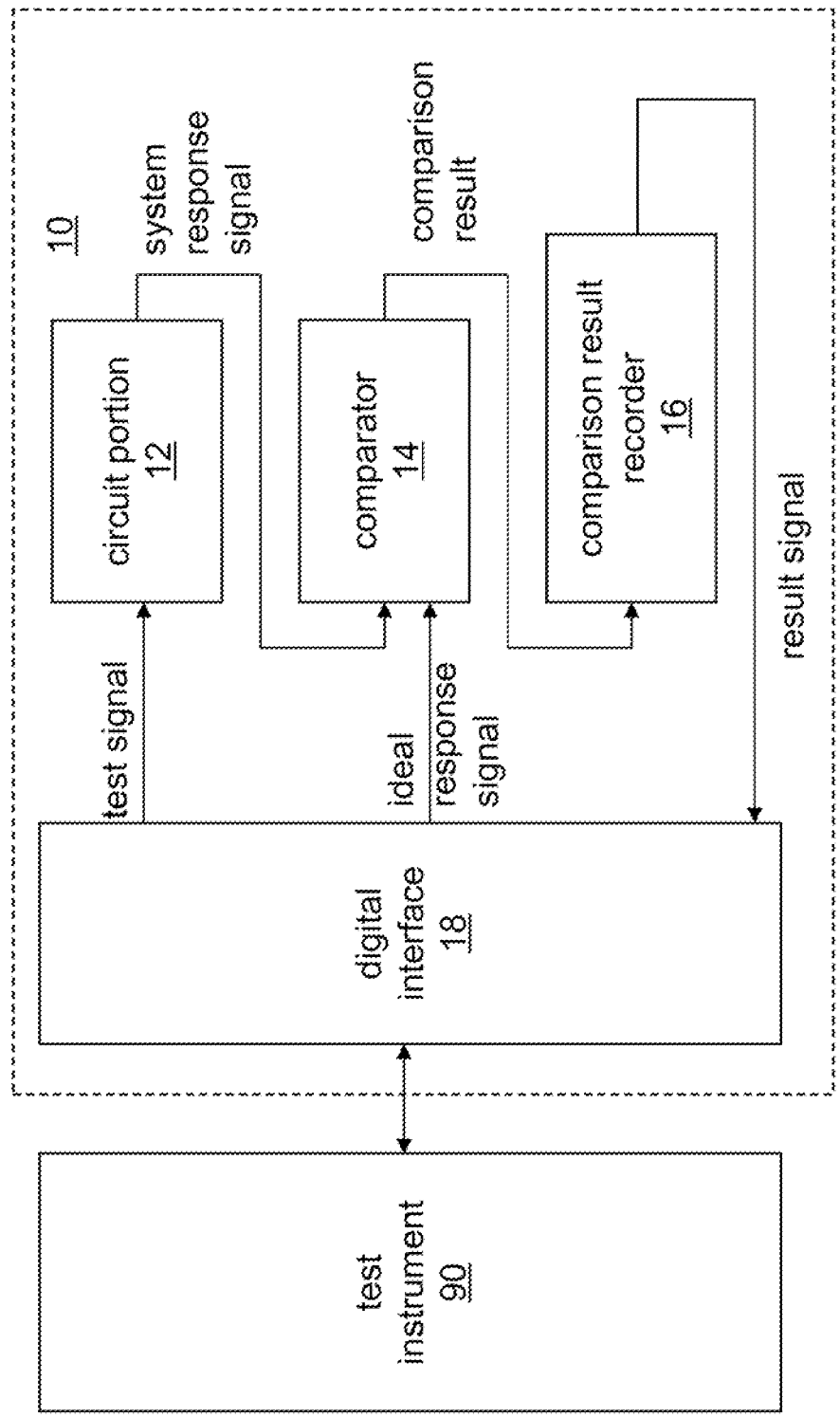
FIG. 6 illustrates a high level diagram for the system for testing electronic circuits.

FIG. 6 illustrates a system block diagram of a sixth embodiment of the system for testing electronic circuits. In the single embodiment or in some embodiments, the system for testing electronic circuits 10 comprises a circuit portion 12 to be tested, a comparator 14, a comparison result recorder 16, and a digital interface 18. The circuit portion 12 to be tested, the comparator 14, and the comparison result recorder 16 may be operatively connected to the digital interface 18. The digital interface 18 may be used for transferring a test signal to the circuit portion 12 to be tested in the single embodiment or in some embodiments. The digital interface 18 may also be configured for transferring an ideal response signal to the comparator 14 and for receiving a test result signal from the comparison result recorder 16. The digital interface 18 may be configured to connect to the test instrument 90. The digital interface 18 may comprise, but not limited to, an I2C or a serial peripheral interface in some embodiments.

In addition or in the alternative, the digital interface 18 may also be configured in conjunction with other embodiments.

In one or more embodiments, the circuit portion 12 to be tested comprises an analog circuit. In these embodiments where the circuit portion 12 comprises an analog circuit instead of a digital circuit or a memory circuit as described above, an ideal response signal of the analog circuit does not generally comprise a digital 0 or digital 1 but may comprise a voltage signal, a current signal, a frequency signal, a time signal, etc. In addition or in the alternative, an acceptable range of a system response signal of the analog circuit does not generally comprise a single value but may comprise a tolerance range so that various items to be compared by the comparator 14 and various items to be recorded by the comparison result recorder 16 may be slightly different from those when the circuit portion 12 to be tested comprises a digital circuit or a memory circuit. The following paragraphs illustrate various configurations by way of examples.

Figure 9:
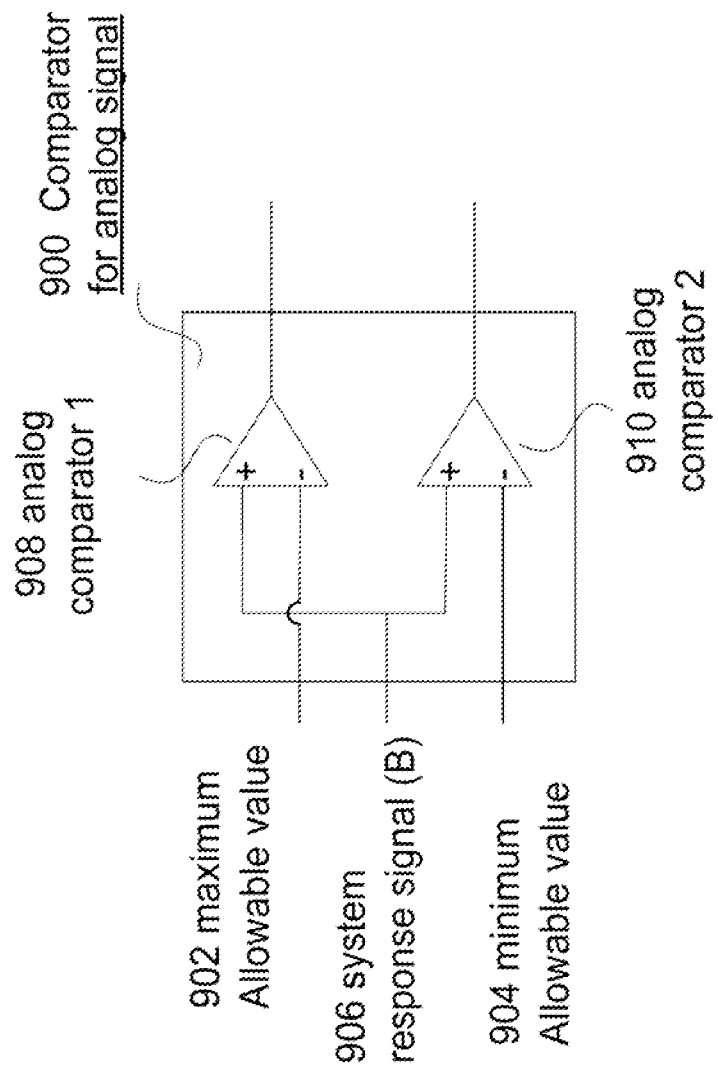
FIG. 9 illustrates a schematic representation of a comparator with multiple comparators for analog signals in some embodiments.

In one or more embodiments, the circuit portion 12 to be tested comprises an analog circuit; a system response signal of the circuit portion 12 to be tested in response to a test signal comprises a circuit property signal, for example, a voltage signal; an acceptable range of the circuit portion 12 to be tested in terms of the test item may comprise an ideal response signal voltage as the nominal value bound between a maximum allowable value and a minimum allowable value; and the comparator 14 compares values of voltages. As illustrated in FIG. 9 which illustrates a comparator for analog signals, the comparator 14 compares the system response signal 906 of the circuit portion 12 to be tested with the maximum allowable value (902) by using the analog comparator 1 (908). The comparator 14 further compares the system response signal 906 of the circuit portion 12 to be tested with the minimum allowable value 904 by using the analog comparator 2 (910).

The comparison result recorder 16 records a comparison result. In some embodiments where the comparison result shows that the system response signal voltage of the circuit portion 12 to be tested is smaller than the maximum allowable value, and the system response signal voltage of the circuit portion 12 to be tested is greater than the minimum allowable value, the circuit portion 12 to be tested is normal in terms of the test item. Otherwise, the circuit may not function normally. In one or more embodiments, the test instrument 90 may directly obtain a signal of the maximum allowable value, and a signal of the minimum allowable value. In the embodiments as illustrated in FIG. 9, if the outputs of comparators 908 and 910 constitute true and false, this indicates that the portion of the circuit under test is functioning normally. If the outputs of the comparators 908 and 910 are both true or are both false, this indicates that the portion of the circuit under test is not functioning normally.

In one or more embodiments, the circuit portion 12 to be tested comprises an analog circuit, a system response signal of the circuit portion 12 to be tested in response to a test signal comprises a current signal, the comparator 14 compares values of currents, the comparison result recorder 16 records a comparison result. When the comparison result shows that the system response signal current of the circuit portion 12 to be tested is within a range bounded by the maximum and minimum allowable values, the circuit portion 12 to be tested is considered normal in terms of the test item; otherwise, the circuit is considered not functioning normally. In one or more embodiments, a comparator 14 capable of comparing currents may comprise two resistors plus a combination of an operational amplifier and a latch circuit, wherein the resistors may convert input currents into voltages, and the operational amplifier and the latch circuit may be used to generate a comparison result.

Figure 10:
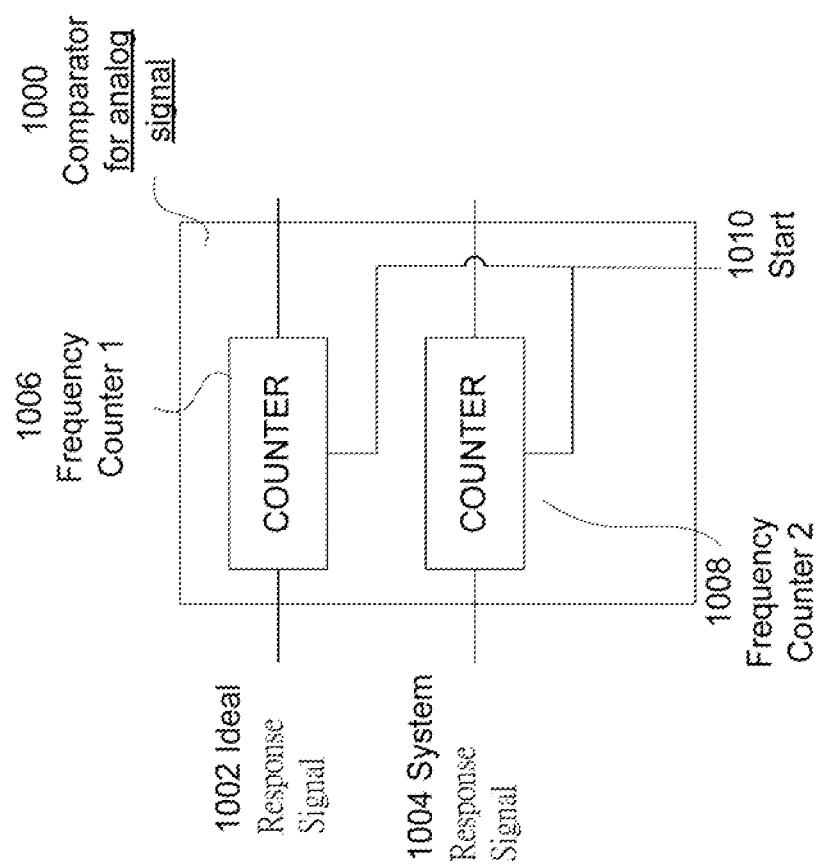
FIG. 10 illustrates a schematic representation of a comparator with multiple counters for analog signals in some embodiments.

In one or more embodiments, the circuit portion 12 to be tested comprises an analog circuit, and a system response signal of the circuit portion 12 to be tested in response to a test signal comprises a frequency signal. In one or more embodiments, the comparator 14 compares values of frequencies. In one or more embodiments, a method for comparing values of frequencies of the signals comprises calculating numbers of occurrences of rising edges (or falling edges) of two input signals. In these embodiments, the method performs the action of calculating the numbers of occurrences of rising (or falling) edges by using one or more counters. In one or more embodiments, the comparator 14 calculates the number of occurrences of the rising edges of a first signal. The comparator 14 may further calculate the number of occurrences of the rising edges of a second signal with a particular number of occurrences of the first signal in some embodiments. In some embodiments where the number of occurrences of the rising edges of the second signal is within a range defined by a target number of occurrences with a maximum allowable number of occurrences and a minimum allowable number of occurrences, the circuit is considered to be functioning normally; otherwise, the circuit is not considered to be functioning normally. In some embodiments, the comparator 1000 for analog signals may use a single comparator rather than a plurality of comparators as illustrated in FIG. 10. In these embodiments, the single counter may count the rising (or falling) edges of the system response signal 1004 within a predetermined time period and determine the frequency of the system response signal 1004. The single counter may then compare the so determined frequency of the system response signal 1004 with the known frequency of the ideal response signal 1002 and determine whether the system response signal 1004 indicates normal functioning of the circuit portion under test. In these embodiments, the predetermined time period for determining the rising (or falling) edges need to be precise because a small variation of the time period corresponds to a large variation in the determined frequency of the system response signal 1004. In the embodiments as illustrated in FIG. 10 with a plurality of counters, both counters 1006 and 1008 are determining the number of rising (or falling) edges of the system response signal and the ideal response signal within the same time period. Therefore, the time period for the multiple counters configuration as illustrated in FIG. 10 needs not to be precise as long as both counters are determining the number of rising (or falling) edges within the same time period. 1010 Start indicates the initializing and invoking of the counters' functions for the comparator 14.

In one or more embodiments, the circuit portion 12 to be tested comprises an analog circuit, and a system response signal of the circuit portion 12 to be tested in response to a test signal comprises a time signal. In the single embodiment or in some embodiments, a system response signal of the circuit portion 12 to be tested in response to a test signal comprises a time signal. The time signal represents the time when the rising edge (or falling edge) of the signal occurs.

The comparator 14 compares a sequence of times when the rising edges of the signals occur in the single embodiment or in some embodiments. That is, the comparator 14 receives a system response signal from the circuit portion 12 to be tested at a specific instant and an ideal response signal within a temporal range, which is defined by an upper bound, a lower bound, and a nominal time, and then compares a sequence of times when one or more rising edges occur. In some embodiments where a rising edge of the system response signal received from the circuit portion 12 to be tested occurs between the rising edges of the one or more ideal response signals within the temporal range, the circuit is considered to be functioning normally; otherwise, the circuit is determined not to be functioning normally. One of ordinary skill in the art clearly understands that similar approaches may also be used to compare a sequence of times when falling edges of signals occur or to compare durations between two rising edges (or between two falling edges) of signals with two pulses at a certain interval.

Figure 11:
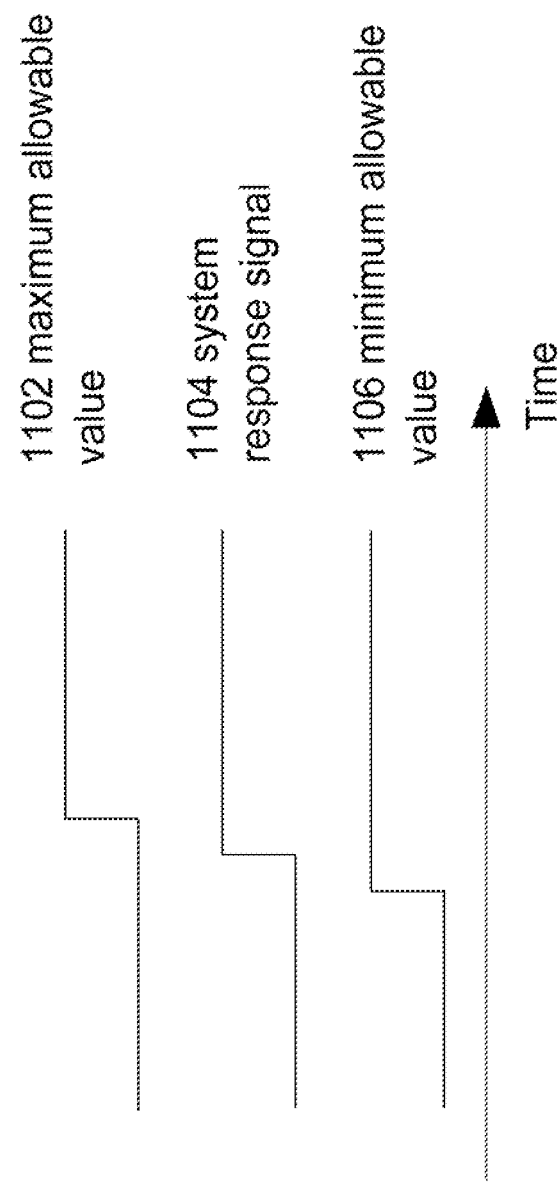
FIG. 11 illustrates a schematic representation of a system response signal relative to signals with maximum and minimum allowable values that indicates success of a test.

For example, the rising edges of two input signals may be compared to determine which signal arrives earlier than the other in some embodiments. In some embodiments, the arrival time of the response signal under test may be compared to the nominal time plus the upper bound for the temporal range or to the nominal time minus the lower bound for the temporal range for such determination. The schematic representation of the signals indicating the success of a test is illustrated in FIG. 11 where the rising edge of the system response signal 1104 falls between the rising edges of the signal with the maximum allowable value and the signal with the minimum allowable value. In one or more embodiments, the comparator 14 may comprise a combination of an operational amplifier and a latch circuit to compare values of two input voltages.

In one or more embodiments, the circuit portion 12 to be tested comprises an analog circuit, and a system response signal of the circuit portion 12 to be tested in response to a test signal comprises a mixed-signal circuit. In the single embodiment or in some embodiments, the mixed-signal refers to a signal that does not comprise a simple voltage signal, current signal, frequency signal, time signal, or other similar types of signals, but comprises an analog signal mixed with a variety of properties. In some embodiments, the variety of properties comprises, for example but not limited to, voltage, current, frequency, or duration, etc. In one or more embodiments, the comparator 14 may compare a variety of analog signals. In the single embodiment or in some embodiments, the variety of analog signals comprises, for example but not limited to, voltage signal(s), current signal(s), temporal information, or frequency information or signal(s).

In one or more embodiments, the comparator 14 may comprise a plurality of portions for respectively comparing a plurality of properties of the analog signals. For example, the comparator 14 may comprise two or more sub-comparators or comparator modules (hereinafter sub-comparators), wherein at least one of the sub-comparators may be used for comparing voltage signal(s) or information, and at least one other sub-comparators may be used for comparing current signal(s) or information. In some embodiments, the comparator 14 may comprise a single comparator module or sub-comparator, wherein the single sub-comparator is executed multiple times to determine whether the system response signal(s) falls within the allowable temporal range. For example, in these embodiments, the sub-comparator may be first executed to compare the timing information of the system response signal under test to a range defined by the nominal time and the upper bound and then executed to compare the timing information of the system response signal under test to another range defined by the nominal time and the lower bound.

In one or more embodiments, the circuit portion 12 to be tested comprises a mixed-mode circuit. In the single embodiment or in some embodiments, the mixed-mode circuit refers to a circuit that does not contain only a purely digital circuit or a purely analog circuit but comprises one or more digital portions and one or more analog portions. In one or more embodiments, the comparator 14 may comprise a plurality of portions for respectively comparing digital signals and analog signals.

Although various different embodiments, the scope is not limited thereto. One of ordinary skill in the art may combine various embodiments as described above or modify some or all of the elements according to the spirit of the embodiments. Therefore, the combination or modification of various embodiments of some or all of the elements in the embodiments is also deemed as falling within the scope.

In one or more embodiments, the comparator 14 may be an Exclusive OR (XOR) gate or an Exclusive Not OR (XNOR or NXOR) gate. In some embodiments, the XOR gate or the XNOR gate comprises at least two input ports (input port A and input port B) and at least one output port. The input port A and the input port B may be respectively used to receive the system response signal and the ideal response signal as input signals.

The following Table 1 represents a truth table of the XOR gate and the XNOR gate indicating a relation between the input ports and the output port.

TABLE 1

Truth table of XOR gate

| Input Port A | Input Port B | Output Port A XOR B |
|---|---|---|
| 0 | 0 | 0 |
| 0 | 1 | 1 |
| 1 | 0 | 1 |
| 1 | 1 | 0 |

Truth table of XNOR gate

| Input Port A | Input Port B | Output Port A XNOR B |
|---|---|---|
| 0 | 0 | 1 |
| 0 | 1 | 0 |
| 1 | 0 | 0 |
| 1 | 1 | 1 |

As can be seen from the above table, in some embodiments where the comparator 14 comprises the XOR gate, the XOR gate outputs a "logic 0" signal if the system response signal is identical to the ideal response signal. That is, outputs a correct signal. In some embodiments where the system response signal is different from the ideal response signal, the XOR gate outputs a "logic 1" signal. That is, the system outputs an error signal. In some embodiments where the comparator 14 comprises an XNOR gate, the XNOR gate outputs a "logic 1" signal if the system response signal is identical to the ideal response signal. That is, the system outputs a correct signal in these embodiments. In these embodiments, the XNOR gate outputs a "logic 0" signal if the system response signal is different from the ideal response signal. That is, the system outputs an error signal.

The comparator 14 may also compare one input signal or a plurality of input signals at the same time in the single embodiment or in some embodiments. In the single embodiment or in some embodiments where the comparator 14 compares a plurality of input signals at the same time, the comparator 14 may comprises a plurality of XOR gates and perform an OR operation on outputs of the plurality of the plurality of XOR gates. That is, the output result is a "logic 1" signal if any error occurs, and "logic 0" signal if no error occurs. In the one or more embodiments, the comparator 14 may comprise a plurality of XNOR gates and perform an AND operation on outputs of the plurality of XNOR gates. That is, the output result is a "logic 0" signal if any error occurs, and a "logic 1" signal if no error occurs.

Figure 7A:
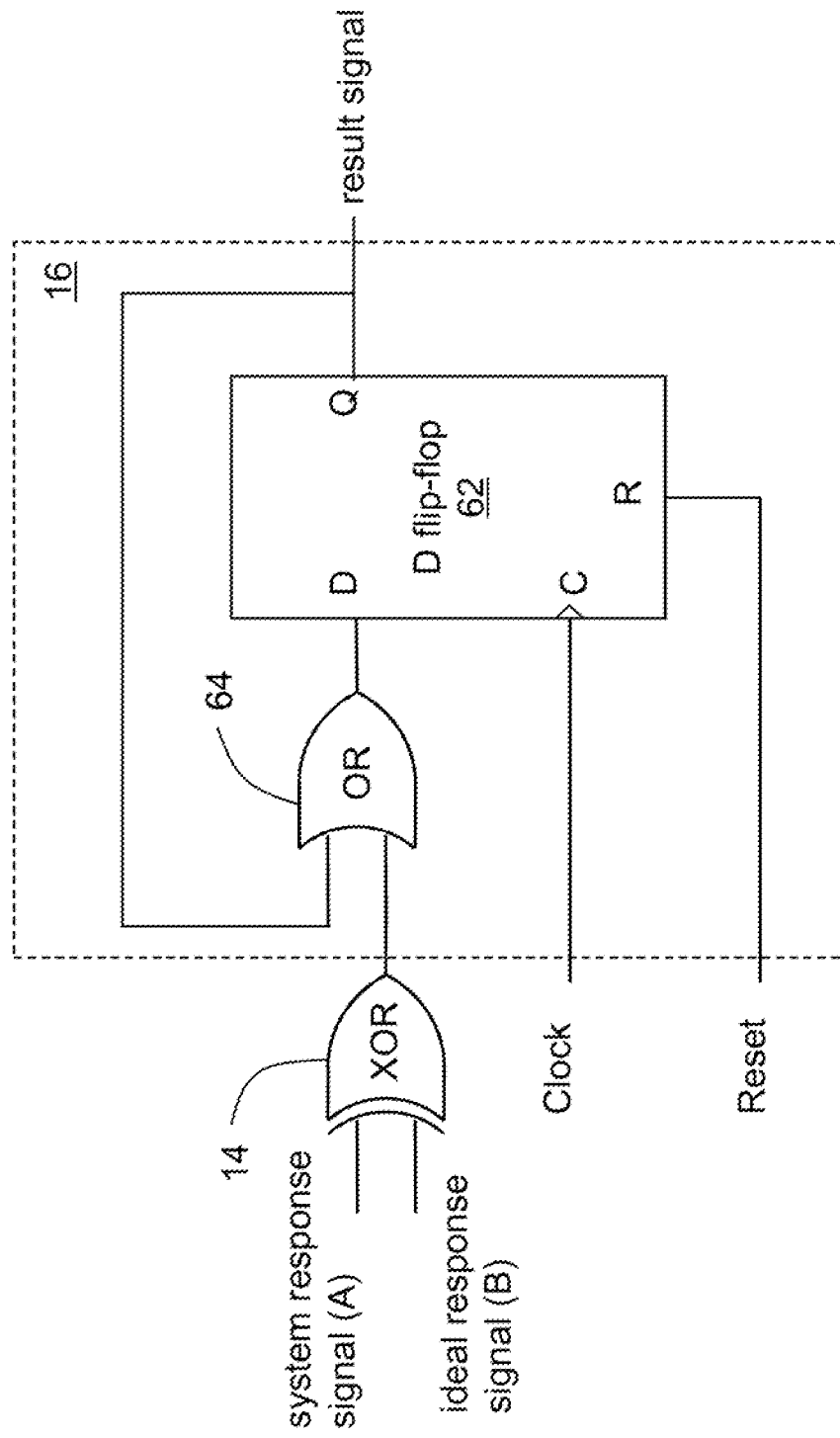
FIGS. 7A-B illustrate high level schematic diagrams for the comparison result recorder in some embodiments.

In the single embodiment or in some embodiments, the comparison result recorder 16 may comprise a circuit as illustrated in FIG. 7A. FIG. 7A comprises an exemplary circuit diagram of the comparison result recorder 16. The comparison result recorder 16 comprises a D flip-flop 62 and an OR gate 64 in some embodiments. The D flip-flop 62 comprises an input port D, an output port Q, a clock output port C, and a reset input port R. In the exemplary circuit, the comparison result recorder 16 may be operatively connected to the comparator 14. An XOR gate for realizing functions of the comparator 14 is used in this example. In this embodiment, a rising edge trigger D flip-flop is used. After a reset occurs, the output signal Q is reset to "logic 0".

After at least one clock rising edge trigger occurs, the output signal of the output port Q of the D flip-flop is a signal of the input port D when a previous clock rising edge trigger occurs in some embodiments. In these embodiments, a relation between the output port Q and the input port D may be shown by the following truth table as illustrated in Table 2.

TABLE 2

| Clock | D | Q | $Q_{prev}$ |
|---|---|---|---|
| Rising edge | 0 | 0 | X |
| Rising edge | 1 | 1 | X |
| Non-Rising | X | $Q_{prev}$ | |

In some other embodiments, the signal input by the input port A of the XOR gate comprises a system response signal, and A(t) represents a signal input by the port A at a $t^{th}$ rinsing edge trigger. The signal input by the input port B comprises an ideal response signal, and B(t) represents a signal input by the port B at the $t^{th}$ rinsing edge trigger. Q(t) represents an output signal of the output port Q of the D flip-flop before the $t^{th}$ rinsing edge trigger. In these embodiments, a relation of the circuit in FIG. 7A may be expressed as: $Q(t+1)=Q(t)+(A(t)\oplus B(t))$. In the preceding equation, the operator "+" represents an OR operation, and "$\oplus$" represents an XOR operation (an exclusive disjunction.) The relation may be shown by the following truth table as illustrated in Table 3.

TABLE 3

| Q(t) | A(t) | B(t) | Q(t + 1) |
|---|---|---|---|
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 1 |
| 1 | 1 | 0 | 1 |
| 1 | 1 | 1 | 1 |

As it may be seen from the above table, only when the output signal Q(t) of the output port Q is "logic 0", and A(t) is identical to B(t), will the output signal Q(t+1) of the output port Q at a next time be "logic 0". Accordingly, if Q(t) is "logic 0", it may be determined that Q(t−1) is also "logic 0". Therefore, only when no error occurs after the time when the D flip-flop 62 is reset and till the $t^{th}$ rinsing edge trigger, will the output Q(t+1) of the D flip-flop 62 be "logic 0". In other cases, if A(t) is different from B(t), Q(t) is "logic 1".

Figure 7B:
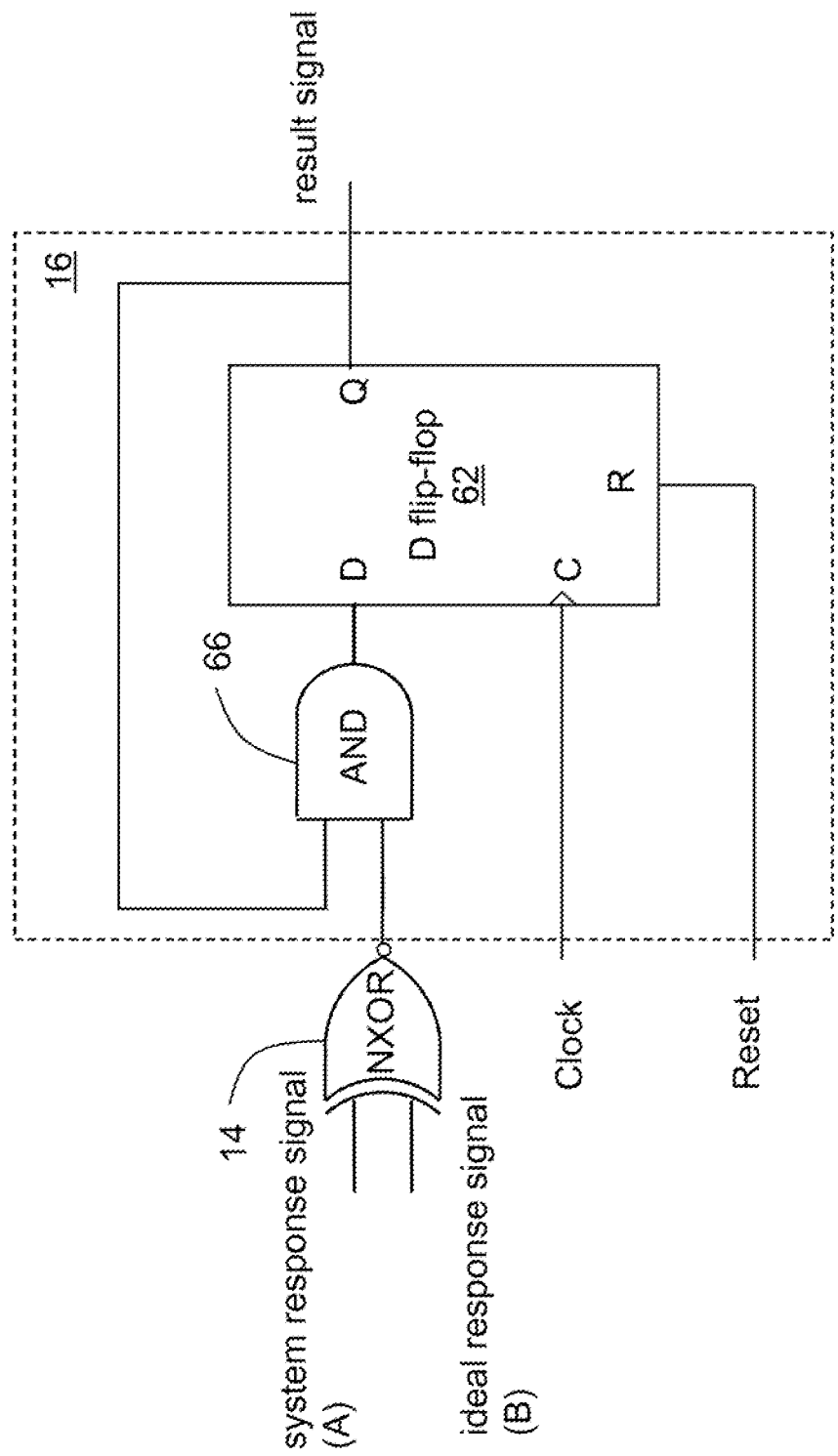

In addition to the circuit in FIG. 7A, the comparison result recorder 16 may also be formed by a circuit in FIG. 7B in some embodiments. The comparison result recorder 16 comprises a D flip-flop 62 and an AND gate 66. In the exemplary circuit, the comparison result recorder 16 is operatively connected to the comparator 14. In addition, the comparator 14 is an XNOR gate in these embodiments as illustrated in FIG. 7B.

A relation of the circuit in FIG. 7B may be expressed as: $Q(t+1)=Q(t) \wedge (\overline{A(t)\oplus B(t)}(A(t)B(t))$. "$\wedge$" represents an AND operation (a logical conjunction), and "$\overline{A(t)\oplus B(t)}$" represents an XNOR operation between A(t) and B(t). The relation may be shown by the following truth table as illustrated in Table 4.

TABLE 4

| Q(t) | A(t) | B(t) | Q(t + 1) |
|------|------|------|----------|
| 0 | 0 | 0 | 0 |
| 0 | 0 | 1 | 0 |
| 0 | 1 | 0 | 0 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

As it may be seen from the above table, only when the output signal Q(t) of the output port Q is "logic 1", and A(t) is identical to B(t), will the output signal Q(t+1) of the output port Q at a next time be "logic 1". Accordingly, if Q(t) is "logic 1", it may be determined that Q(t−1) is also "logic 1". In these cases, only when no error occurs after the time when the D flip-flop 62 is reset and till the $t^{th}$ rinsing edge trigger, will the output Q(t+1) of the D flip-flop 62 be "logic 1". In other cases, if A(t) is different from B(t), Q(t) is "logic 0".

With the exemplary circuits as shown in FIG. 7A or 7B, the comparison result recorder 16 may record whether an error occurs within a time period.

Although the structure of the comparison result recorder 16 is described above through examples, various embodiments are not limited thereto. Persons skilled in the art may also devise similar comparison result recorder 16 by using other elements so as to realize identical or substantially similar functions such as recording comparison results. In one or more embodiments, the comparison result recorder 16 may comprise a non-volatile memory so the error comparison circuit 10 may still retain the comparison result, which is obtain before the power is shut off, even after the power is shut off.

The exemplary circuits in FIG. 7A or 7B provide a simplified illustration for an embodiment of the comparison result recorder 16 for the ease of illustration and explanation. The exemplary circuits of these embodiments provide a recorder for storing bit-by-bit comparison results. Persons skilled in the art may also device a similar comparison result recorder 16 by using other elements so as to record more complex comparison results without departing from the spirit of various embodiments disclosed herein.

In one or more embodiments, the comparison result recorder 16 may record a comparison result of a plurality of bits.

In one or more embodiments, the comparison result recorder 16 may receive location information from the test instrument 90 indicating which part(s) of the circuits is (are) being tested and may thus record the location at which a particular comparison is conducted together with the comparison results.

In one or more embodiments, the comparison result recorder 16 may receive information about one or more test items from the test instrument 90 while receiving comparison results at substantially the same time and thus record the one or more test items for which a comparison is conducted. In the single embodiment or in some embodiments, the one or more test items comprise one or more of a test on a portion of the circuit under test, a memory test, a read and/or write test, a high speed test, a high temperature test, a combination of any of the aforementioned tests, or any other tests of the portion of the circuit under test. One of ordinary skill in the art will clearly understand that even though receiving comparison results and receiving information about one or more test, items are designed or intended to occur at the same time, they may not necessarily occur at exactly the same time due to various factors such as various delays in signal transmission, etc. In these embodiments, the method or the system may then correspond the comparison results received to more precise point(s) in the test item based at least in part upon the information about the one or more test items so as to precise locate which part(s) of a test item causes the comparison results.

In the one or more embodiments, the error comparison circuit 10 may be located on a semiconductor substrate. In these embodiments, the circuit portion 12 to be tested or the memory 22, the comparator 14, and the comparison result recorder 16 are located on a semiconductor substrate.

A semiconductor substrate may be divided into a chip area and a dicing area. The chip area comprises an area that will be retained after dicing for die preparation. The dicing area comprises an area on the semiconductor substrate that is not the chip area.

FIG. 8A illustrates a schematic view of a first exemplary configuration on a semiconductor substrate. In the first exemplary configuration, the error comparison circuit 10 may be located in the chip area 41 in some embodiments. In addition or in the alternative, the chip area 41 further comprises a plurality of bonding pads 32. The plurality of bonding pads 32 comprises a plurality of metal interfaces that may be electrically connected with an external interface after a chip is packaged. At least one of the bonding pads 32 may be electrically connected to the error comparison circuit 10 in some embodiments. The test instrument 90 described in FIG. 1 may use one or more probes to connect to one or more of the plurality of bonding pads 32 and transfer the test signal(s) and the ideal response signal(s) to the error comparison circuit 10 through the one or more probes.

FIG. 8B illustrates a schematic view of a second configuration on a semiconductor substrate. In the second exemplary configuration, the error comparison circuit 10 may be located in the chip area 41. In order to reduce the risk that the probe may cause damage to one or more of the plurality of bonding pads or bump pads 32 during test, the chip area 41 may further comprise a plurality of testing pads 34. The plurality of testing pads 34 may be dedicated to probe-testing but not for wire bonding or for establishing external connection(s) outside a packaged or an unpackaged (e.g., a flip chip) electronic circuit in some embodiments. The plurality of testing pads 34 may be located in the chip area 41. The plurality of testing pads 34 are electrically connected to the error comparison circuit 10 in the single embodiment or in some embodiments. The test instrument 90 may use one or more probes to connect to one or more of the plurality of testing pads 34 and transfer the test signal(s) and the ideal response signal(s) to the error comparison circuit 10 through the one or more probes. In some other embodiments, rather than connecting the system for testing electronic circuits via a plurality of testing pads, the system for testing electronic circuits 10 may be connected to the test instrument 90 by using at least one bump pad or at least one bonding pad.

FIG. 8C illustrates a schematic view of a third exemplary configuration on a semiconductor substrate in some embodiments. In the third exemplary configuration, the error comparison circuit 10 may be located in the chip area 41, and the testing pads 34 are located in the error comparison circuit 10. In this exemplary configuration, the error comparison circuit 10 and the plurality of testing pads 34 may be considered as a hard-macro when laying out a circuit. In these embodiments, this exemplary configuration may be easily embedded into a common circuit design. In these embodiments, the physical design of this exemplary configuration may be predefined and regarded as the intellectual property by the manufacturer.

Figure 8D:
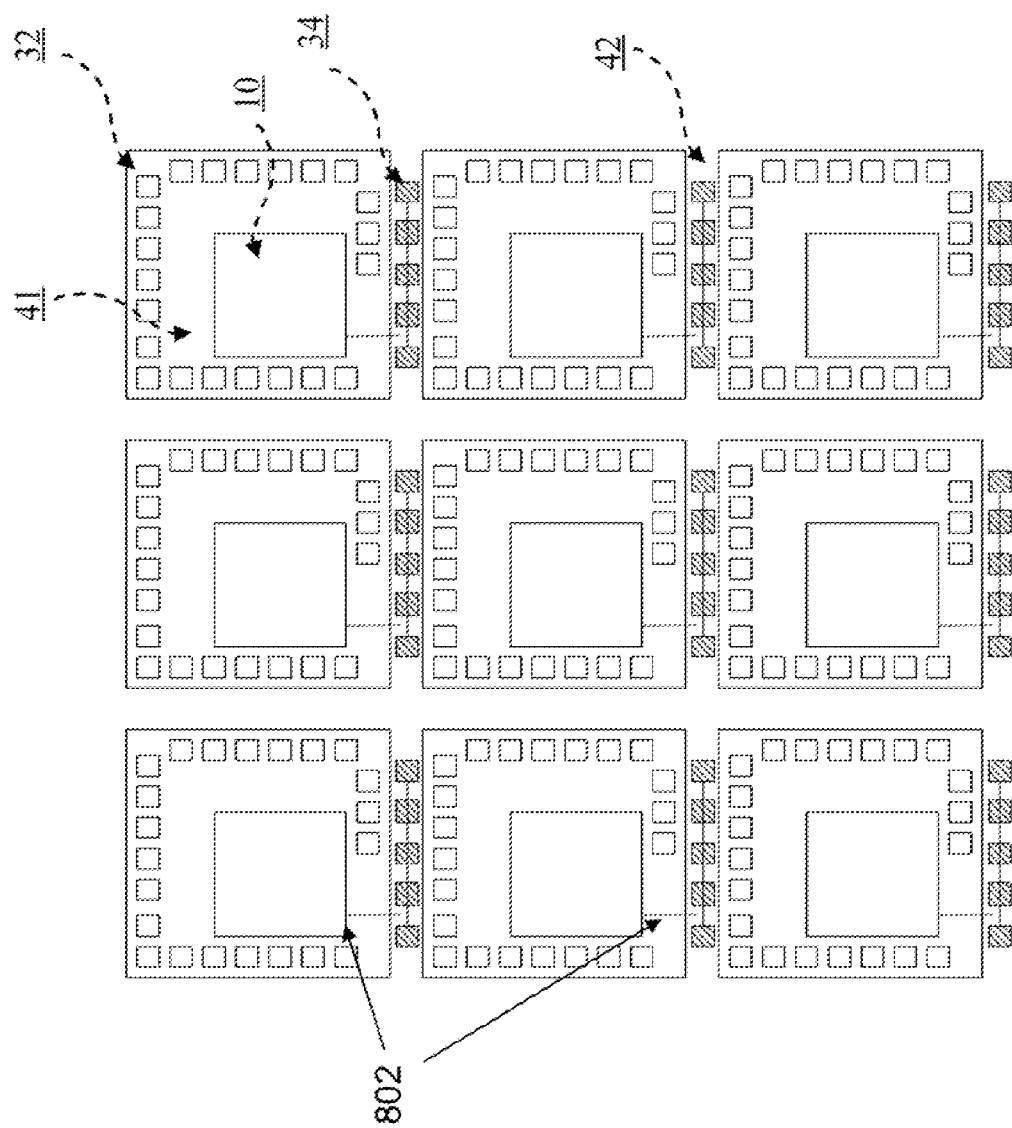

FIG. 8D illustrates a schematic view of a fourth exemplary configuration on a semiconductor substrate. In the fourth exemplary configuration, the error comparison circuit 10 may be located within the chip area 41, and the plurality of testing pads 34 may be located in the dicing area 42 in some embodiments. Because the plurality of testing pads 34 are not used for wire bonding during IC packaging or for electrically connecting the chips to external circuits or interfaces after the chips are separated, the plurality of testing pads 34 may be sacrificed during chip dicing. In these embodiments as illustrated in FIG. 8D, each of the chips on the semiconductor substrate corresponds to its own system for testing electronic circuits 10 which interfaces with the test equipment 90 (not shown) via a plurality of testing pads 34 and a bus 802. In these embodiments, the bus 802 may comprise a serial bus, a parallel bus, or a combination thereof to carry data and is used to transmit and receive signals and information such as the testing information in FIG. 1C.

In one or more embodiments, the plurality of testing pads 34 may be located in the dicing area 42, and the plurality of testing pads 34 connected to the same chip may be located on the same side of the chip area 41 so as to optimize space utilization. In some embodiments, a test probe may be used to contact a plurality of testing pads 34. In the other direction of the dicing area 42, for example, a longitudinal direction in FIG. 8D, testing lines may be disposed. If the plurality of testing pads 34 connected to the same chip are not located on the same side of the chip area 41, the distance between chips may need to be increased during chip configuration so as to dispose the testing pads 34 required. One of ordinary skill in the art clearly understands that other design choices do not depart from the spirit of various embodiments in terms of the design principles but may occupy a large area in practical applications. In some embodiments, at least a portion of the system for testing electronic circuits 10 is located in the dicing area 42.

Figure 8E:
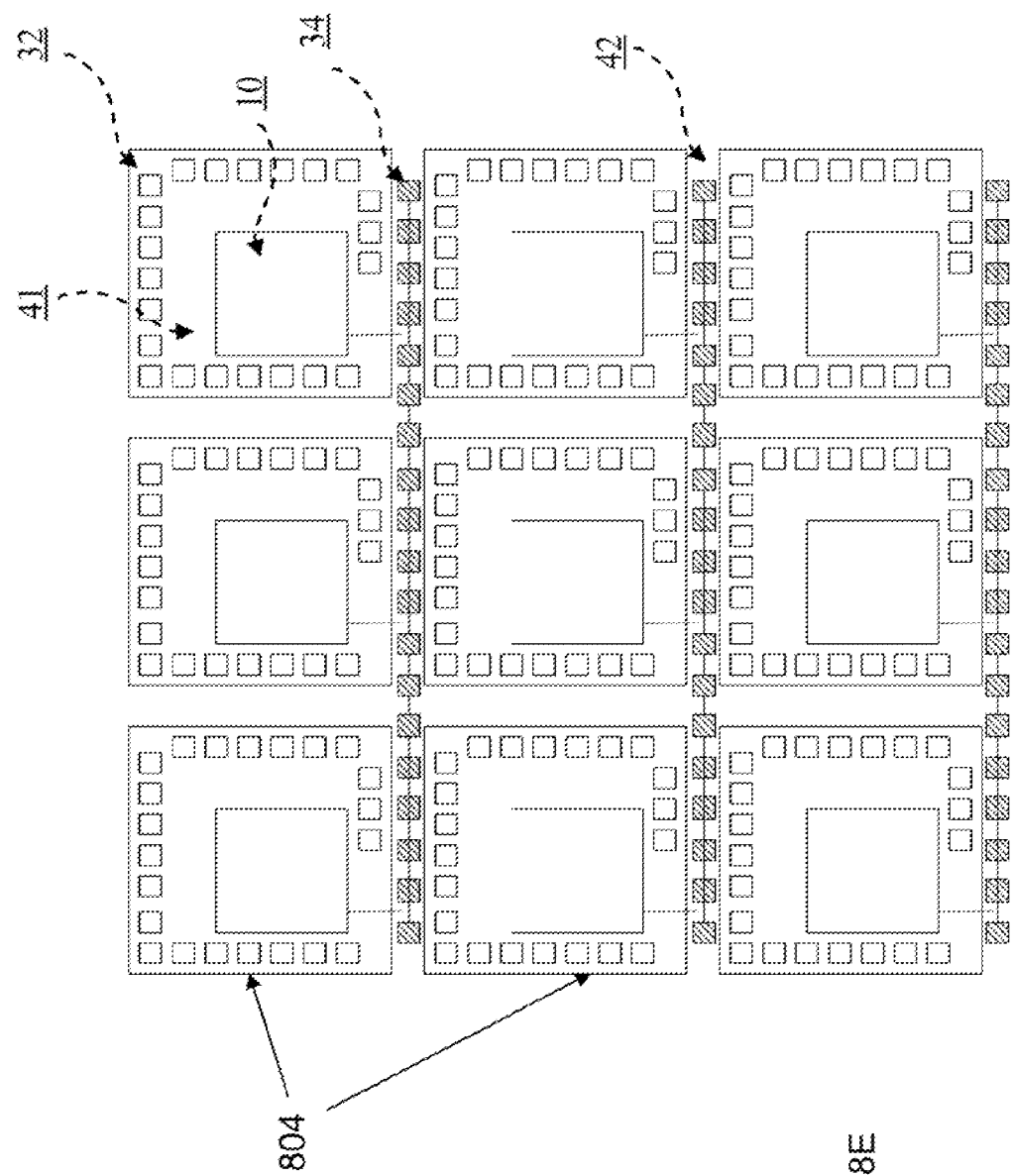

FIG. 8E illustrates a schematic view of another exemplary configuration on a semiconductor substrate. A set of testing pads 34 may be located in the dicing area 42 in some embodiments. The set of testing pads 34 may be operatively connected to a plurality of error comparison circuit 10. For example, as shown in FIG. 8E, a set of testing pads 34 are connected to four chip areas 41 in the illustrated exemplary configuration. Moreover, each error comparison circuit 10 is located in the chip area 41 in these embodiments. In this exemplary configuration, a chip may comprise an address decoder (not shown) and a switch module (not shown) disposed therein in some embodiments. The switch module selectively electrically connects the testing pads 34 to the error comparison circuit 10. The test instrument 90 may transmit an address signal to the address decoder through the probe. The address decoder may transmit a corresponding control signal to one of the switch modules according to the address signal. In the single embodiment or in some embodiments, the test signal comprises the address signal or the control signal. The switch module receiving the control signal is actuated and thus enables the testing pads 34 to be electrically connected to the error comparison circuit 10 corresponding to the switch module. In these embodiments, the probe of the test instrument 90 transmits the test signal and the ideal response signal to the error comparison circuit 10 based at least in part upon the address signal. In these embodiments as illustrated in FIG. 8E, the testing pads 34 are operatively connected to the corresponding system for testing electronic circuits 10 in a plurality of chips via respective buses 804. In these embodiments, the testing pads for operatively connecting a plurality of chips (and hence a plurality of system for testing electronic circuits 10) may be further connected to a switch or a multiplexer (MUX) as described above to determine which test signals are to be transmitted to which chips and which test result signals come from which chip. In shall be noted that in FIGS. 8A-E, the system for testing electronic circuits 10 is located within the chip area 41 in some embodiments. Nonetheless, the system for testing electronic circuits 10 may also be located in some other areas, such as in the dicing areas of a semiconductor substrate, in some embodiments.

Although the error comparison circuit 10 is disposed on a semiconductor substrate, various embodiments are not limited thereto. In some embodiments, the error comparison circuit 10 may also be disposed on a printed circuit board (PCB) or various other substrates.

Figure 12:
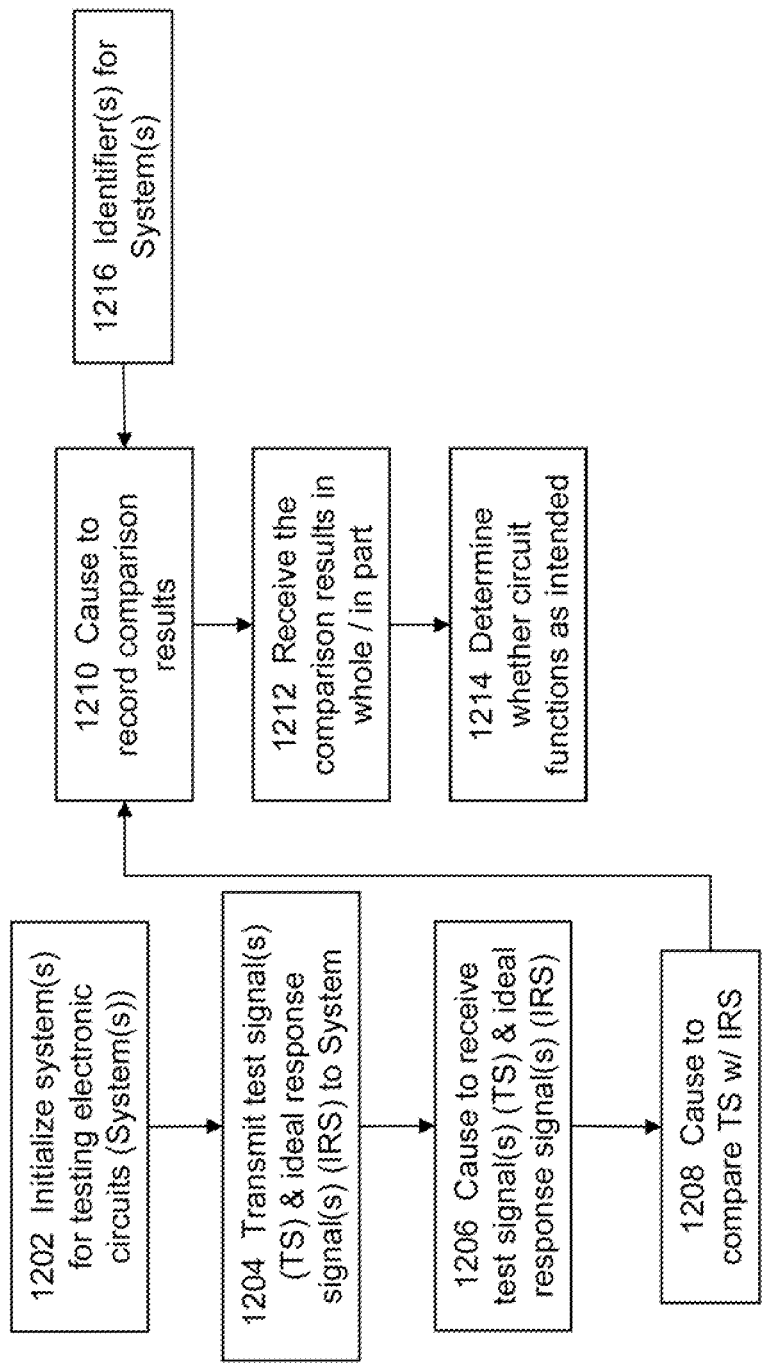
FIG. 12 illustrates a high level block diagram for a method for testing electronic circuits in some embodiments.

In addition to the various circuit structures and circuit configurations described above, some embodiments further provide a method for testing electronic circuits with an error comparison circuit. FIG. 12 illustrates a high level block diagram of a method for testing an electronic circuit according to one or more embodiments. It shall be noted that various embodiments that are described above with reference to the systems may also apply to the method described below to the extent that such various embodiments described above with reference to the systems may also apply to the method for testing electronic circuits.

At 1202, the method for testing electronic circuits comprises initializing one or more systems for testing electronic circuits in a single embodiment or in some embodiments. In some embodiments, the act of initializing one or more systems for testing electronic circuits comprise power on the electronic circuit(s) under test, resetting the comparison result recorder(s) if needed or desired, or resetting the electronic circuit(s) under test if needed or desired. At 1204, the method for testing electronic circuits comprises transmitting one or more test signals, test patterns, or test vectors (hereinafter test signal) and the corresponding one or more ideal response signals to the one or more system for testing electronic circuits in the single embodiment or in some embodiments. At 1206, the method for testing electronic circuits comprises causing the one or more system for testing electronic circuits to receive the one or more test signals and the one or more ideal response signals in the single embodiment or in some embodiments.

At 1208, the method for testing electronic circuits comprises causing the one or more system for testing electronic circuits to compare the one or more test signals with the corresponding one or more ideal response signals in the single embodiment or in some embodiments. At 1210, the method for testing electronic circuits comprises causing the one or more system for testing electronic circuits to record at least a part of the result(s) of the act of comparing the one or more test signals with the corresponding one or more ideal response signals. In some embodiments where multiple system for testing electronic circuits are used such as illustrated in FIG. 2B, the method for testing electronic circuits comprises receiving a plurality of error comparison identifiers (1216) for the act of 1210 where at least the identifiers are used to attribute the recorded comparison result(s) to the corresponding system for testing electronic circuits.

At 1212, the method for testing electronic circuits comprises receiving the recorded comparison result(s) in whole or in part in the single embodiment or in some embodiments. At 1214, the method for testing electronic circuits comprises determining whether the electronic circuit under test functions as intended or designed based at least in part upon the received results at 1212 in the single embodiment or in some embodiments.

Referring to FIG. 13, which illustrates further details of an act of using the test signal(s) for various purposes in some embodiments. Once at least one of the one or more signals is transmitted to the one or more system for testing electronic circuits, the method for testing electronic circuits may further optionally comprise using the at least one test signal (1302) for at least one of 1304,1306, or 1308. The method may use the at least one test signals for controlling one or more digital interfaces (1304). The method may use the at least one test signals for controlling a multiplexer, a switch, or a selector for testing multiple portions of a circuit (1306). The method may use the at least one test signals for controlling a multiplexer, a switch, or a selector for testing multiple electronic circuits.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense. Moreover, unless otherwise explicitly stated, various processes need not be performed in order to achieve the intended purpose(s) in the order as they are described in the foregoing specification. Similarly, unless otherwise explicitly stated, various modules or parts of the system need not be invoked in the order they are described in the foregoing specification in order to achieve the intended purpose(s).

What is claimed is:

1. An apparatus for testing an electronic circuit on a semiconductor substrate, comprising:
   an interface that is to receive a test signal from a test equipment as an input to the apparatus to test the electronic circuit on the semiconductor substrate, wherein
      the test equipment comprises a test signal generator and is situated external to the semiconductor substrate on which the electronic circuit is located;
   a comparison module which comprises a second electronic circuitry and is to compare a system response signal with an ideal response signal, which is generated by the test equipment, to indicate whether the electronic circuit functions correctly and to generate a result, wherein
      the apparatus is to further determine whether the electronic circuit functions correctly based at least in part upon the result, and
      at least a part of the second electronic circuitry is located on the semiconductor substrate on which the electronic circuit to be tested is located;
   a recording module which comprises a third electronic circuitry and is to transmit at least a portion of the result to the test equipment and to store the result in a computer or machine readable storage medium, wherein
      the interface of the apparatus is designed to transmit the test signal from the test equipment to the electronic circuit on the semiconductor substrate and to transmit the ideal response signal and a comparison result signal between the test equipment and the comparison module.

2. The apparatus of claim 1, further comprising:
a first electronic circuitry which is to output the system response signal in response to the test signal and is operatively connected to at least one of the comparison module and the recording module.

3. The apparatus of claim 1, further comprising:
a first interface which to perform at least one of:
   transmitting the test signal to the electronic circuitry,
   transmitting the ideal response signal to the comparison module, or
   receiving the result from the recording module.

4. The apparatus of claim 2, wherein the electronic circuitry and at least a part of the comparison module or the recording module is located on a semiconductor substrate.

5. The apparatus of claim 4, wherein the semiconductor substrate comprises a dicing area and a chip area in which the electronic circuitry is located.

6. The apparatus of claim 5, in which the electronic circuitry is operatively connected to one or more pads, wherein the one or more pads are located in the chip area, the dicing area, or a combination of the chip area and the dicing area.

7. The apparatus of claim 6, further comprising:
a plurality of electronic circuitries which are to output corresponding system response signals in response to the test signal and are operatively connected to at least one of the one or more pads.

8. The apparatus of claim 7, further comprising:
one or more switches that are to transmit the test signal to at least one of the plurality of the electronic circuitries based at least in part upon a control signal.

9. The apparatus of claim 1, further comprising a non-transitory computer or machine readable storage medium that is at least part of the electronic circuitry.

10. The apparatus of claim 1, wherein the electronic circuitry comprises a digital circuit, an analog circuit, or a memory circuit.

11. The apparatus of claim 7, wherein the plurality of electronic circuitries comprise at least one of a digital circuit, an analog circuit, a memory circuit, or a combination of at least two of the digital circuit, the analog circuit, and the memory device.

12. The apparatus of claim 9, wherein:
the non-transitory computer or machine readable storage medium comprises one or more primary memory cells, one or more redundant memory cells, and
the one or more redundant memory cells are used to replace one or more functions of the one or more primary memory cells.

13. A method for testing an electronic circuit, comprising:
initializing a system for testing the electronic circuit;
causing the system for testing electronic circuit to receive or receiving, by using an interface circuitry of the system, a test signal from a test equipment and an ideal response signal by using a signal receiving module to test the electronic circuit on a semiconductor substrate, wherein
   the system does not include the test equipment from which the interface circuitry of the system is to receive the test signal, and
   the test equipment is situated external to the semiconductor substrate on which at least some of the electronic circuit to be tested is situated;
causing to compare or comparing, by using a comparison circuitry that is located on the semiconductor substrate on which an electronic circuit under test is located, the ideal response signal, which is generated by the test equipment to indicate whether the electronic circuit functions correctly, with a system response signal, wherein the method further comprises determining whether the electronic circuit functions correctly based at least in part upon the result; and causing to record or recording a result of the act of causing to compare or comparing the ideal response signal with the system response signal in a non-transitory computer or machine readable storage medium and causing to transmit or transmitting at least a portion of the result to the test equipment, wherein the test signal is transmitted from the test equipment to the electronic circuit on the semiconductor substrate via the interface circuitry, and the ideal response signal and a comparison result signal are transmitted between the test equipment and the comparison circuitry.

14. The method of claim 13, further comprising:
receiving at least a part of the result which is used to determine whether the first electronic circuit under test is functioning as designed.

15. The method of claim 13, wherein the test signal comprises a control signal that is used for performing at least one of:
controlling a digital interface of the system for testing electronic circuits;
controlling a multiplexer or a switch for testing a plurality of portions of the first electronic circuit under test; or
controlling a multiplexer or a switch for testing a plurality of electronic circuits under test.

16. The method of claim 13, further comprising one or more acts of:
transmitting the test signal and the ideal response signals to a plurality of systems, which include the system for testing electronic circuits, for testing electronic circuits substantially simultaneously; and
receiving at least a portion of the result from at least one of the plurality of systems for testing electronic circuits based at least in part upon an identifier of the at least one of the plurality of the systems for testing electronic circuits.

17. The method of claim 13, further comprising:
operatively connecting a portion of the system for testing electronic circuits to the electronic circuit under test via one or more pads.

18. An apparatus for testing an electronic circuit on a semiconductor substrate, comprising:

an interface that is to receive a test signal from a test equipment as an input to the apparatus to test an analog portion of the electronic circuit on the semiconductor substrate, wherein the electronic circuit includes the analog portion and a digital portion, the apparatus does not include the test equipment from which the interface of the apparatus is to receive the test signal, and the test equipment comprises a test signal generator and is situated external to the semiconductor substrate on which the electronic circuit is located;

a comparison module which comprises a second electronic circuitry and is to compare an analog system response signal, instead of digital system response signals from the digital portion, with an ideal response signal, which is generated by the test equipment, to indicate whether the analog portion of the electronic circuit functions correctly and to generate a result, wherein the apparatus is to further determine whether the electronic circuit functions correctly based at least in part upon the result, and at least a part of the second electronic circuitry is located on the semiconductor substrate on which the electronic circuit to be tested is located;

a recording module which comprises a third electronic circuitry and is to transmit at least a portion of the result to the test equipment and to store the result in a computer or machine readable storage medium, wherein the interface of the apparatus is designed to transmit the test signal from the test equipment to the electronic circuit on the semiconductor substrate and to transmit the ideal response signal and a comparison result signal between the test equipment and the comparison module.

19. The apparatus of claim 18, wherein the ideal response signal comprises an analog signal or a range of multiple values for comparison with the analog system response signal.

20. The apparatus of claim 1, wherein the interface is designed to connect the apparatus to at least one other identical apparatus to test a plurality of electronic circuits, each of which is identical to the electronic circuit on the semiconductor substrate, in parallel.

* * * * *